United States Patent [19]
Holzman et al.

[11] Patent Number: 5,347,132
[45] Date of Patent: Sep. 13, 1994

[54] POSITION SENSITIVE DETECTOR PROVIDING POSITION INFORMATION WITH ENHANCED RELIABILITY AND PERFORMANCE

[75] Inventors: Louis M. Holzman; Thomas F. Kelly, both of Madison; Patrick P. Camus, Middleton, all of Wis.

[73] Assignee: Wisconsin Alumni Research Foundation, Madison, Wis.

[21] Appl. No.: 99,938

[22] Filed: Jul. 30, 1993

[51] Int. Cl.$^5$ .............................................. G01T 1/29
[52] U.S. Cl. ............................ 250/389; 250/385.1; 250/394
[58] Field of Search ............... 250/385.1, 389, 394, 250/370.10, 214 LA, 369

[56] References Cited

U.S. PATENT DOCUMENTS

| | | |
|---|---|---|
| 3,209,201 | 9/1985 | Anger. |
| 3,934,143 | 1/1976 | Prag ............................ 250/370.10 |
| 4,395,636 | 7/1983 | Anger et al. ..................... 250/366 |
| 4,870,265 | 9/1989 | Asmussen et al. ............. 250/214 LA |
| 5,061,850 | 10/1991 | Kelly et al. ..................... 250/306 |

OTHER PUBLICATIONS

C. Martin, et al., "Wedge-and-Strip Anodes for Centroid-Finding Position-Sensitive Photon and Particle Detectors," Rev. Sci. Instrum., vol. 52, No. 7, Jul. 1981, pp. 1067–1074.
M. Lampton, et al., "Delay Line Anodes For Microchannel-Plate Spectrometers," Rev. Sci. Instrum., vol. 58, No. 12, Dec. 1987, pp. 2298–2304.
Christopher Martin, et al., "Mosaic Wedge-and-Strip Arrays For Large Format Microchannel Plate Detectors," IEEE Transactions on Nuclear Science, vol. 36, No. 1, Feb. 1989, pp. 836–840.
J. Gethyn Timothy, "Photon-Counting Detector Systems: Current Status and Future Prospects," in Photoelectronic Image Devices 1991 (book), Institute of Physics, IOP Publishing LTD., Bristol, England, 1991, pp. 85–96.
O. H. W. Siegmund, et al., "High Resolution Delay Line Readouts for Astronomical Spectroscopy" in Photoelectronic Image Devices 1991 (book), Institute of Physics, IOP Publishing Ltd., Bristol, England, 1991, pp. 123–130.

*Primary Examiner*—Carolyn E. Fields
*Attorney, Agent, or Firm*—Foley & Lardner

[57] ABSTRACT

A position sensitive detector has one or more wedge-and-wedge anode units, each of which has four electrodes on a planar surface arranged in a plurality of sets of four wedge-shaped electrode elements each, with the sets extending across the anode unit. Two of the electrode elements become progressively wider from set to set from one side of the anode unit to the other, while the other two electrode elements become progressively narrower. The respective electrode elements in each set are electrically connected together to complete the four electrodes. The charge measured on each of the four electrodes can be utilized to determine the X and Y coordinates of an event which results in a charge cloud impacting the anode, with redundant information available from the four electrodes. The coordinates calculated using charge information from any three of the electrodes can be compared with information calculated from the charge measured from the fourth electrode and two of the other electrodes, and the two sets of calculations can be compared. If each set of calculations does not yield the same result, two or more events have occurred simultaneously at different positions, and the measured data can be rejected to avoid erroneous data. The electrodes of large arrays of such anode units can be readily connected together to cover a large detector area with a minimal number of data output lines required, and with the capability of determining the position of simultaneous events by taking advantage of the redundant information available from each anode unit.

44 Claims, 21 Drawing Sheets

POSITION SENSITIVE DETECTOR PROVIDING POSITION INFORMATION WITH ENHANCED RELIABILITY AND PERFORMANCE

This invention was made with United States Government support awarded by the National Science Foundation (NSF), Grant No. DMR-89-11332. The United States Government has certain rights in this invention.

FIELD OF THE INVENTION

This invention pertains generally to the field of detectors for charged particles and electromagnetic radiation, and particularly to one- and two-dimensional position sensitive detectors.

BACKGROUND OF THE INVENTION

One- and two-dimensional electron, ion or photon impact position detectors are used in a variety of applications, including position sensitive atom probes, spectrometry, electron spectroscopy, atomic collision process observations, astronomical detectors such as those used for single photon imaging in very low light for ground and space based telescopes, low light night vision devices, and medical imaging equipment. Several designs have been developed for detectors capable of determining the point of occurence in two dimensions of an event such as the impact of a charged particle or photon at a discrete position on the detector.

One type of detector which is particularly useful for detecting charged particles, but which also may be utilized to detect photon impact, combines a microchannel plate with a detector anode which has electrodes arranged in planar fashion on a flat substrate. In what is commonly referred to as a wedge-and-strip anode, three electrodes are formed on the substrate: one electrode comprises a series of rectangular strips which increase progressively in width from one side of the anode to the other, another electrode comprises a series of identical wedges which extend across the anode between the strips, and the third electrode spans the interstices between the other two electrodes. An example of such a wedge-and-strip anode is shown in U.S. Pat. No. 5,061,850, where the detector is used in a position sensitive atom probe. Various designs for wedge-and-strip detectors are also shown in U.S. Pat. Nos. 3,209,201 to Anger, 4,395,636 to Anger, et al., 4,870,265 to Asmussen, et al., and in articles by C. Martin, et al., "Wedge-and-Strip Anodes For Centroid-Finding Position Sensitive Photon and Particle Detectors," Rev. Sci. Instrum. Vol. 52, No. 7, Jul. 1991, pp. 1067–1074, and C. Martin, et al., "Mosaic Wedge-and-Strip Arrays For Large Format Microchannel Plate Detectors," IEEE Transactions on Nuclear Science, Vol. 36, No. 1, February 1989, pp. 836–840. By amplifying the charge which results from a single event, such as a particle or photon impact, allowing the amplified charge cloud to land on the three (or sometimes four) electrodes, and integrating the charge on each electrode, the position of the event in two dimensions can be calculated. In a typical wedge-and-strip anode design having three electrodes A, B and C, where the measured charges on the electrodes from a single event are $Q_a$, $Q_b$ and $Q_c$, the X and Y position of impact of the incident particle or photon can be calculated from the formulas:

$$X = 2Q_a/(Q_a + Q_b + Q_c)$$

$$Y = 2Q_b/(Q_a + Q_b + Q_c)$$

Wedge-and-strip anodes are widely used because they are relatively easy to fabricate, exhibit little geometric distortion, and have high spatial resolution. For microchannel plate outputs in the range of $10^6$ to $10^7$ electrons, amplifier noise is less than $10^3$ electrons and images of $10^5$ to $10^7$ pixels can be obtained.

A main shortcoming of wedge-and-strip anode detectors is that it is not possible to detect the occurrence of multiple simultaneous events using such detectors. If two events occur simultaneously on a single wedge-and-strip anode, measurement of the charges on the electrodes will provide erroneous information, typically indicating that a single event has occurred at a position between the location of the two real events. When such simultaneous events do occur, there is no information from the wedge-and-strip anode which indicates the arrival of simultaneous events.

SUMMARY OF THE INVENTION

In accordance with the present invention, a position sensitive detector includes a wedge-and-wedge anode unit having four electrodes on a planar substrate arranged in a plurality of sets of electrode elements which extend across the anode unit. The four electrode elements in each set are arranged adjacent to one another, with two of the electrode elements tapering from the top to the bottom of the anode and the other two electrode elements tapering from the bottom to the top of the anode. Progressing from set to set from one side to the other of the anode, two of the electrode elements in each set, extending and tapering toward each other from the top and the bottom of the anode, become progressively wider, while the other two electrode elements, also extending and tapering toward each other from the top and the bottom of the anode, become progressively narrower. Each of the first, second, third and fourth electrode elements in each set is electrically connected to the first, second, third, and fourth electrode elements, respectively, in each of the other sets, forming four electrodes. The total charge measured on each of the four electrodes can then be utilized to determine the X and Y coordinates of an event. However, because the measurements of charges on the four separate electrodes are available, the X and Y coordinates can be calculated first using the measured charges from three of the electrodes, and calculated again using the measured charges from any other combination of three electrodes which includes the one electrode which was not utilized to provide the first X and Y coordinate calculation. Because a redundant calculation of the X and Y coordinates may be carried out, if a single event occurs and is detected by the anode, both calculations of the X and Y coordinates will yield the same result. However, if two events occur at different places simultaneously, the two calculated values of X and/or Y in most cases will not be equal to each other and the data can be rejected.

The wedge-and-wedge anode of the invention can be constructed so that each set has four wedge-shaped electrode elements. Electrical connections may then be made to the four electrode elements in each set in various ways. In one manner of connecting the electrode elements, the electrode elements are formed as planar metal areas deposited on a planar insulating substrate (e.g., glass or plastic) with electrical conductors in holes or vias extending down through the top layer of the substrate to a second layer where strips of metal may be deposited such that each strip connects all of the conductors in vias which extend to one of the four electrode elements in each set.

Alternatively, a fully planar anode can be formed having all connections to all the electrode elements on the surface of the substrate. In this type of anode, two of the electrode elements are formed as wedges which extend toward each other from conductive connecting strips at the top and bottom, respectively, of the anode, with the other two electrodes formed as adjacent continuous strips with electrode elements which lie between the two opposed wedge electrode elements. The two continuous electrodes have complementary tapers so that one of the adjacent electrode elements widens from the top to the bottom of the anode while the other narrows, but with all four of the electrode elements progressively changing in width from set to set of electrode elements across the anode. Further, an anode may be formed in which one or more of the electrodes are formed by connecting the electrode elements with strips on a subsurface layer, with the electrode elements of the other electrodes connected on the top surface layer.

To cover a large detector area, many anode units, each of which consists of a plurality of sets of wedge-and-wedge electrode elements, can be arranged in a two dimensional array. The four corresponding types of electrodes in the two dimensional array of anode units may then be connected together along the rows and columns of the array and along the diagonals of the array. If an array were formed of conventional discrete wedge-and-strip anodes, and if the electrodes of each wedge-and-strip anode were interconnected by single leads, it would be impossible to determine the position of two events on different anode units which provide a signal on a common signal lead. To avoid this problem, it would be necessary to provide separate connections to each of the three electrodes in each of the wedge-and-strip anodes, to integrate individually the charge from each electrode, and to provide the integrated signals to a computer or other device which would calculate the position of the events. Thus, for an $N \times N$ array of wedge-and-strip anodes, $3N^2$ independent charge integration circuits would be required. However, by utilizing the wedge-and-wedge anode of the present invention, a large two dimensional array of anodes can be interconnected so that a much smaller number of signal leads is required as compared to the number of leads required with a similar number of wedge-and-strip anodes. If a single event takes place on a single wedge-and-wedge anode unit in an array of such units, the exact location of the event can be readily determined. If two events take place in separate wedge-and-wedge anode units that do not share a common signal lead, the positions of each are calculated in the same way as for an event on a single wedge-and-wedge anode unit in the array. When electrodes in two wedge-and-wedge anode units which share a common signal lead are hit by concurrent events, that shared signal lead contains the sum of the charges on the two electrodes in the two anode units. However, the position of each of the events can still be determined by using the charges from the other six electrodes in the two anode units that are not impacted by both of the concurrent events. As a consequence, the wedge-and-wedge anodes can be interconnected without losing data for multiple events—up to at least three—while requiring only a fraction of the number of signal leads of noninterconnected designs. For an array of $N \times N$ wedge and wedge anode units, $6N-2$ independent charge integration circuits are required. For example, if $49(N=7)$ noninterconnected conventional wedge-and-strip anodes are utilized, 147 signal leads and charge integrators would be required to unambiguously determine the position of multiple events in such an array. However, for a similarly sized array of 49 wedge-and-wedge anode units of the present invention, only 40 signal leads and charge integrators are needed.

The wedge-and-wedge anode array of the invention can be constructed in a manner similar to that used for the single wedge-and-wedge anodes, as described earlier. A $2 \times 2$ array can be constructed as a fully planar anode or as a two layer anode, with the contacts extending to the sides of the anode units and interconnection made external to the anode unit. The electrodes in a larger array may be extended down through vias to additional subsurface layers where a single type of electrode is electrically connected on each layer. One type of electrode may be interconnected by conductors on the top surface with either array unit construction, and a second may be interconnected on the first subsurface layer of the two layer anode.

Further objects, features and advantages of the invention will be apparent from the following detailed description when taken in conjunction with the accompanying drawings.

DETAILED DESCRIPTION OF THE INVENTION

Figure 1:
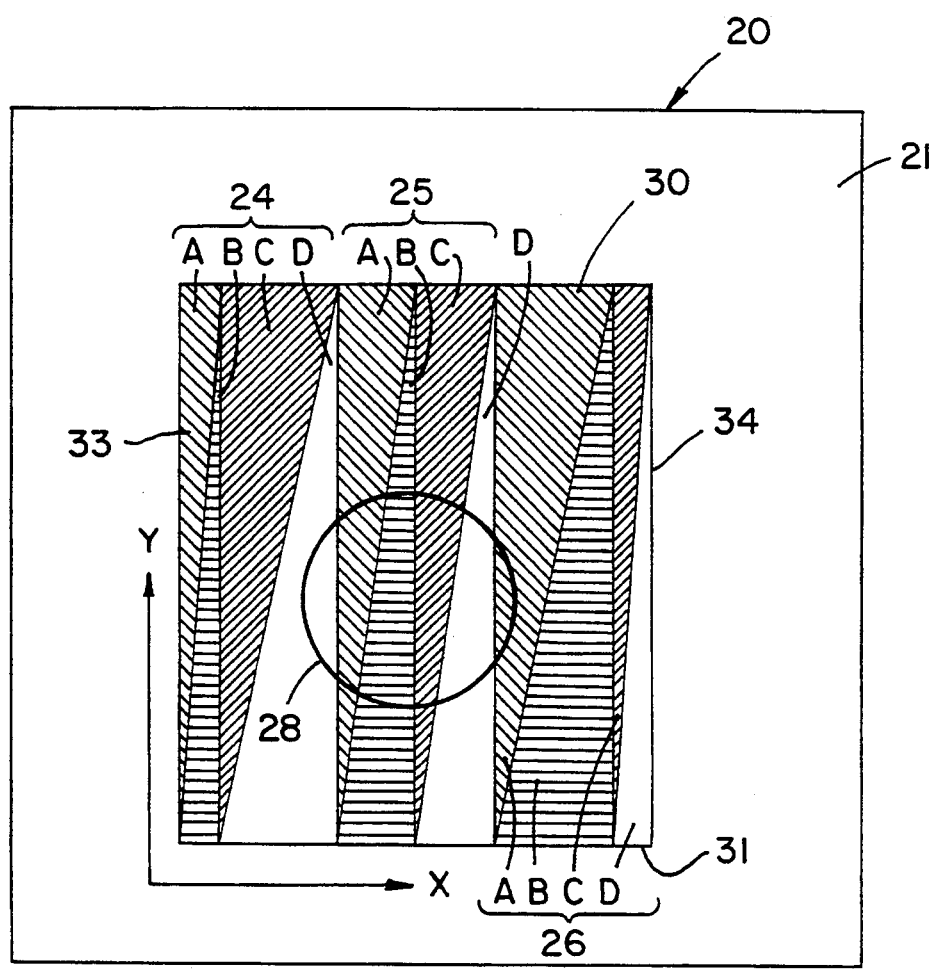
FIG. 1 is a plan view of a wedge-and-wedge anode in accordance with the invention which is simplified for purposes of illustration.

With reference to the drawings, a simple wedge-and-wedge anode which illustrates the principles of the invention is shown generally at 20 in FIG. 1. For purposes of illustration, the anode 20 is formed on a substrate 21 with a plurality of electrically isolated conductive electrode elements formed thereon, for example by electro-deposition of conductive metal (e.g., copper, silver, gold or aluminum, etc.) with subsequent etching away of the metal to provide isolation between the electrode elements. These four types of electrode elements are labelled A,B,C and D in FIG. 1. The substrate 21 may be formed of various insulating materials, for example, glass, plastics, ceramics, a layer of dielectric (e.g., $SiO_2$) on a conducting base, etc. For purposes of illustration, the wedge-and-wedge anode of 20 of FIG. 1 has three sets of electrode elements, the sets labelled 24, 25, and 26 in FIG. 1, although it is understood that, in general, a wedge-and-wedge anode unit would have a larger number of sets of electrode elements. Each of the sets 24, 25 and 26 has first, second, third, and fourth electrode elements, which in FIG. 1 are labelled A, B, C and D and are shaded to help distinguished the separate electrode elements. The electrode elements A, B, C and D are electrically isolated from each other.

When a charge cloud of electrons impacts on the anode 20, the charge cloud covers an area that typically overlaps more than one set of the wedge-shaped electrode elements, as illustrated by the area 28 in FIG. 1. All electrode elements of the same type, A electrode elements, B electrode elements, C electrode elements and D electrode elements, are electrically connected together as described further below to form a first (A) electrode, a second (B) electrode, a third (C) electrode, and a fourth (D) electrode. The charge present on any of the four electrodes will be proportional to the total area of each of the electrodes which is covered by the charge cloud 28. The electrode elements of the A and C electrodes taper downwardly from the top side 30 to the bottom side 31 of the anode, whereas the electrode elements of the B and C electrodes taper down from the bottom side 31 to the top side 30 of the anode. For reference, the positive Y coordinate direction on the anode is from the bottom 31 to the top 30 of the anode and the positive X coordinate direction is from the left side 33 to the right side 34 of the anode. In addition, moving across the anode in the positive X direction from the left side 33 to the right side 34, progressing across the sets 24, 25 and 26, the width of the A and B electrode elements increases linearly and the width of the C and D electrode elements decreases linearly in a manner such that the total width of each set 24, 25 and 26 is constant. It should be understood that the order of placement of the electrode elements does not necessarily have to be as shown in FIG. 1; for example, the position of the electrode elements from left to right could be ABDC or ACDB, etc., as well as ABCD, to form a set of constant width. Consequently, the position of the electron cloud event 28 can be determined from the charge measured on each of the four electrodes.

The four charge measurements available, $Q_a$, $Q_b$, $Q_c$, and $Q_d$, provide more information than is necessary to calculate the position of the charge event 28. Because of the redundant information available from the charges on the electrodes, redundant calculations for the X and Y coordinates on the full wedge elements shown in FIG. 1 can be carried out in accordance with the following expressions:

$$X=Q_a/(Q_a+Q_c) \text{ and } X=Q_b/(Q_b+Q_d)$$

$$Y=Q_a/(Q_a+Q_b) \text{ and } Y=Q_c/(Q_c+Q_d)$$

where X ranges from 0 at the left side 33 of the anode unit to 1 at the right side 34, and Y ranges from 0 at the bottom side 31 to 1 at the top side 30.

Consequently, if, for any reason, the charge information from any one of the four electrodes is unusable, the exact position may still be determined from information provided from the other three electrodes.

It is a particular advantage of the wedge-and-wedge anode structure of the present invention that where charge information from all four electrodes is available, the redundant calculations of the X and Y coordinates can be used to determine whether two or more events have occurred simultaneously. If two events do occur simultaneously at spaced positions, the two values calculated for X and Y will be inconsistent, and the data for that event can be rejected. Generally, the occurrence of two events can be determined unless such events are very close together in either X or Y position (e.g., separated by less than one-150th of the width of the anode) and occur essentially simultaneously.

Figure 2:
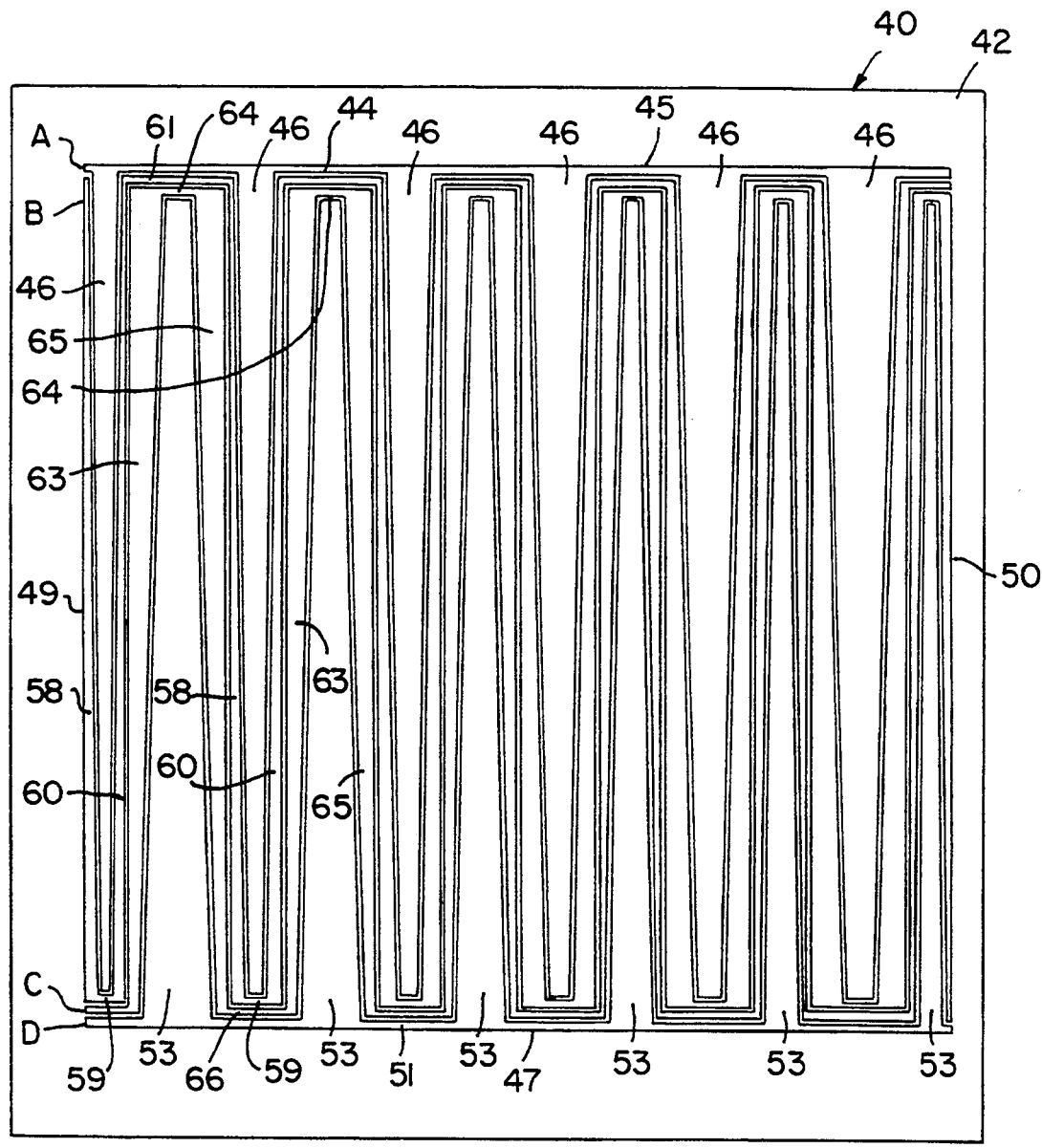
FIG. 2 is a plan view of a wedge-and-wedge anode in accordance with the invention having continuous planar electrodes.

Another implementation of the wedge-and-wedge anode of the present invention is shown generally at 40 in FIG. 2 and comprises four continuous electrodes, labelled A, B, C and D, which are formed on a planar substrate 42.

The first (or A) electrode, has a conducting strip 44 which extends along the top side 45 of the anode and wedge-shaped electrode elements 46 which extend downwardly from the conducting strip 44 toward the bottom side 47 of the anode. The width of the wedge-shaped electrode elements 46 progressively increases when moving from the left side 49 to the right side 50 of the anode.

Similarly, the D electrode has a conducting strip 51 which extends across the width of the anode near the bottom 47 of the anode, and wedge-shaped electrode elements 53 which project from the conducting strip 51 from the bottom 47 toward the top 45 of the anode, with the wedge-shaped elements 53 tapering from their widest point at the connection to the strip 51 to their narrowest dimension at a position near the top edge 45. The A and D electrode elements of FIG. 2 thus correspond to the A and D electrode elements of FIG. 1, with the wedge-shaped electrode elements being truncated in the anode 40 so they do not reach a point.

The B and C electrodes of the anode 40, however, are formed as continuous strips which lie adjacent to one another and between the wedge-shaped electrode elements 46 and 53 of the A and D electrodes, respectively. As illustrated in FIG. 2, in each set of electrode elements, the B electrode has an electrode element portion 58, which extends downwardly from the top 45 to the bottom 47 of the anode and becomes progressively wider until reaching a bottom connecting stub 59 which extends laterally; the B electrode also has an electrode element portion 60 which extends upwardly from the stub 59 toward the top 46, tapering from the bottom to the top. The electrode portions 58, 59 and 60 surround the electrode wedge element 46 of the A electrode. A stub section 61 along the top connects the electrode element portion 60 to another downwardly extending electrode element portion 58 of an adjacent electrode set.

In a similar manner, the C electrode has an upwardly extending electrode element portion 63 which progressively widens as it extends from the bottom to the top, a stub connector 64 which extends across the top of the wedge element 53, and a downwardly tapering electrode element portion 65 which extends down to a bottom stub connector 66. Thus, the electrode portions 63, 64 and 65 surround the wedged-shaped electrode element 53 of the D electrode. It is seen that the C and D electrode elements in each set each comprise two split electrode elements which are connected by conducting stubs at their tops and bottoms.

As in the anode 20, the A and B electrode elements increase in width progressively when moving from the left side 49 to the right side 50 of the anode 40, and the C and D electrode elements decrease progressively in width moving from the left side to the right side. However, within each set of four electrodes there are two B electrode elements—the wedge-shaped portions 58 and 60—, and two C electrode elements—the wedge-shaped portions 63 and 65. In each set of electrodes, the B electrode portions 58 and 60 have the same taper, and the C portions 63 and 65 have the same taper. It is understood that any two of the four electrodes can be formed as the wedge-shaped electrode elements within a set, with the other two electrodes formed as the continuous electrodes which lie between the wedge-shaped elements.

The X and Y coordinates can be determined from the measured charges $Q_a$, $Q_b$, $Q_c$ and $Q_d$ on the A, B, C and D electrodes of the anode 40 in accordance with the expressions given for the anode unit 20 of FIG. 1, i.e.:

$$X = Q_a/(Q_a + Q_c) \text{ and } X = Q_b/(Q_b + Q_a)$$

$$Y = Q_a/(Q_a + Q_b) \text{ and } Y = Q_c/(Q_c + Q_a)$$

However, for truncated wedges such as those in FIG. 2, the X values will range from $X_{min}$ at the left side 49 of the anode unit to $X_{max}$ at the right side 50 and the Y values will range from $Y_{min}$ at the bottom side 47 to $Y_{max}$ at the top side 45, where $X_{min}$, $X_{max}$, $Y_{min}$ and $Y_{max}$ are the X and Y values where a full wedge-and-wedge anode unit has been truncated to form the truncated anode unit. For example, if 20% of the X axis range has been removed from both the left and right sides of the full anode unit and 20% of the Y axis range has been removed from both the bottom and top sides, $X_{min}=0.20$, $X_{max}=0.80$, $Y_{min}=0.20$ and $Y_{max}=0.80$. The equations, for X and Y can be normalized to yield a range of values from 0 to 1 for both X and Y with the following expressions, which compensate for the truncation of the wedge-shaped electrode elements:

$$X_{norm} = [1/(X_{max} - X_{min})] \bullet [Q_a/(Q_a + Q_c) - X_{min}]$$

and $$X_{norm} = [1/(X_{max} - X_{min})] \bullet [Q_b/(Q_b + Q_d) - X_{min}]$$

$$Y_{norm} = [1/(Y_{max} - Y_{min})] \bullet [Q_a/(Q_a + Q_b) - Y_{min}]$$

and $$Y_{norm} = [1/(Y_{max} - Y_{min})] \bullet [Q_c/(Q_c + Q_d) - Y_{min}].$$

The continuous electrode construction of the anode 40 is readily and economically produced—for example, by electroplating metal on a planar substrate and etching to define the electrodes—, and without requiring additional assembly steps to electrically interconnect the electrodes in each of the sets.

Figure 3:
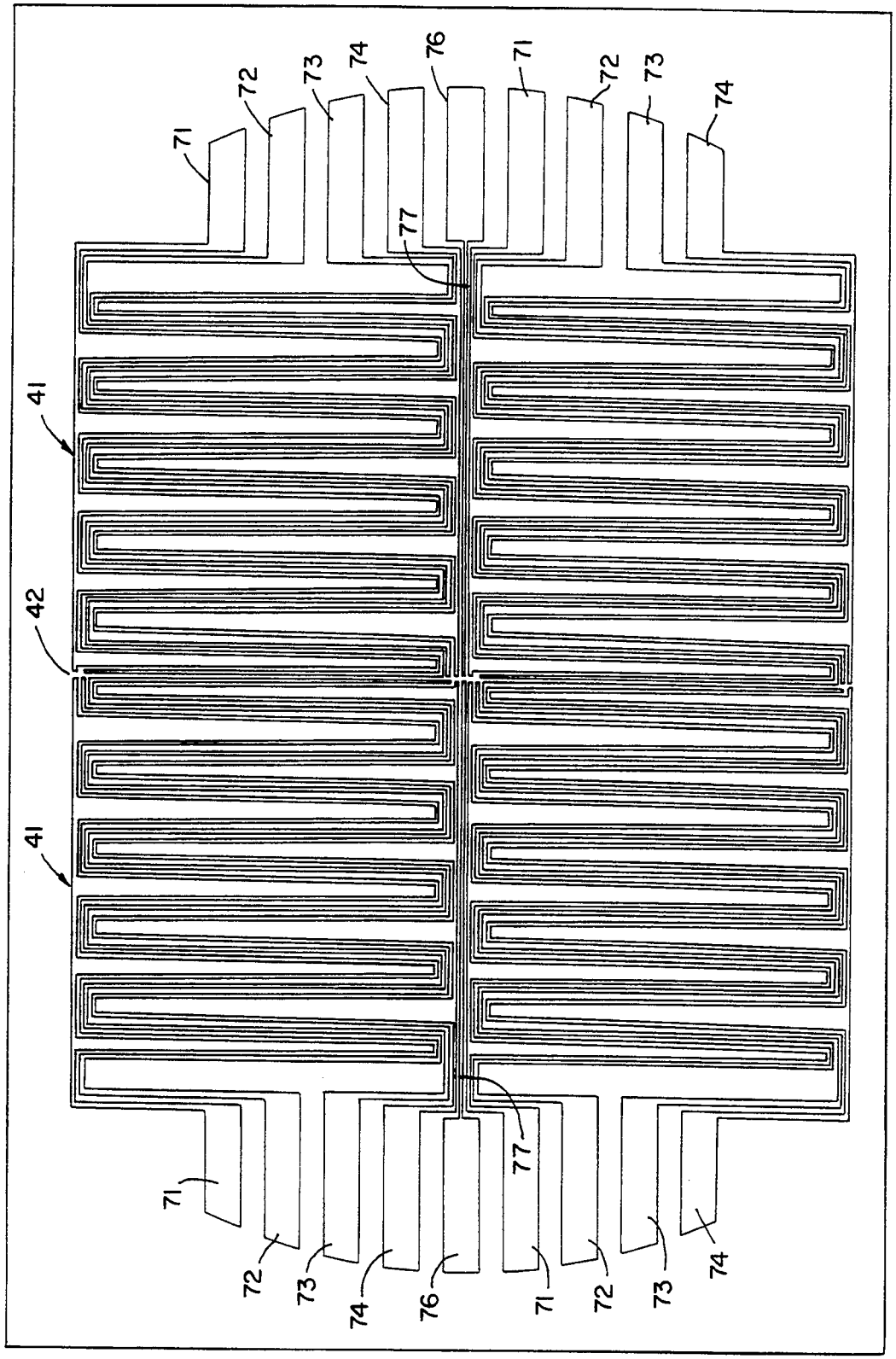
FIG. 3 is a plan view of a two-by-two array of wedge-and-wedge anodes of the type as shown in FIG. 2 which also incorporates resolution enhancement strips.

A plurality of the wedge and wedge anode units 40 can also be formed together on a single substrate, as illustrated in FIG. 3. In this design, a single substrate 42 has four wedge-and-wedge anode units 41 formed thereon, with the conductors from each of the electrodes in each of the units 41 extended out to contact pads 71, 72, 73 and 74 for the A, B, C and D electrodes, respectively, of each electrode unit 41. Optionally, as shown in FIG. 3, two additional connecting pads 76 may connect to conducting strips 77 which extend between the upper and lower units 41 to improve the resolution of the position measurement of an event which lies on the border between an upper unit 41 and a lower units 41 by allowing compensation for the charge that is collected on the conducting strips 44 and 51 and on the connecting stubs 59, 61, 64, and 66 (illustrated in FIG. 2 ).

Figure 4:
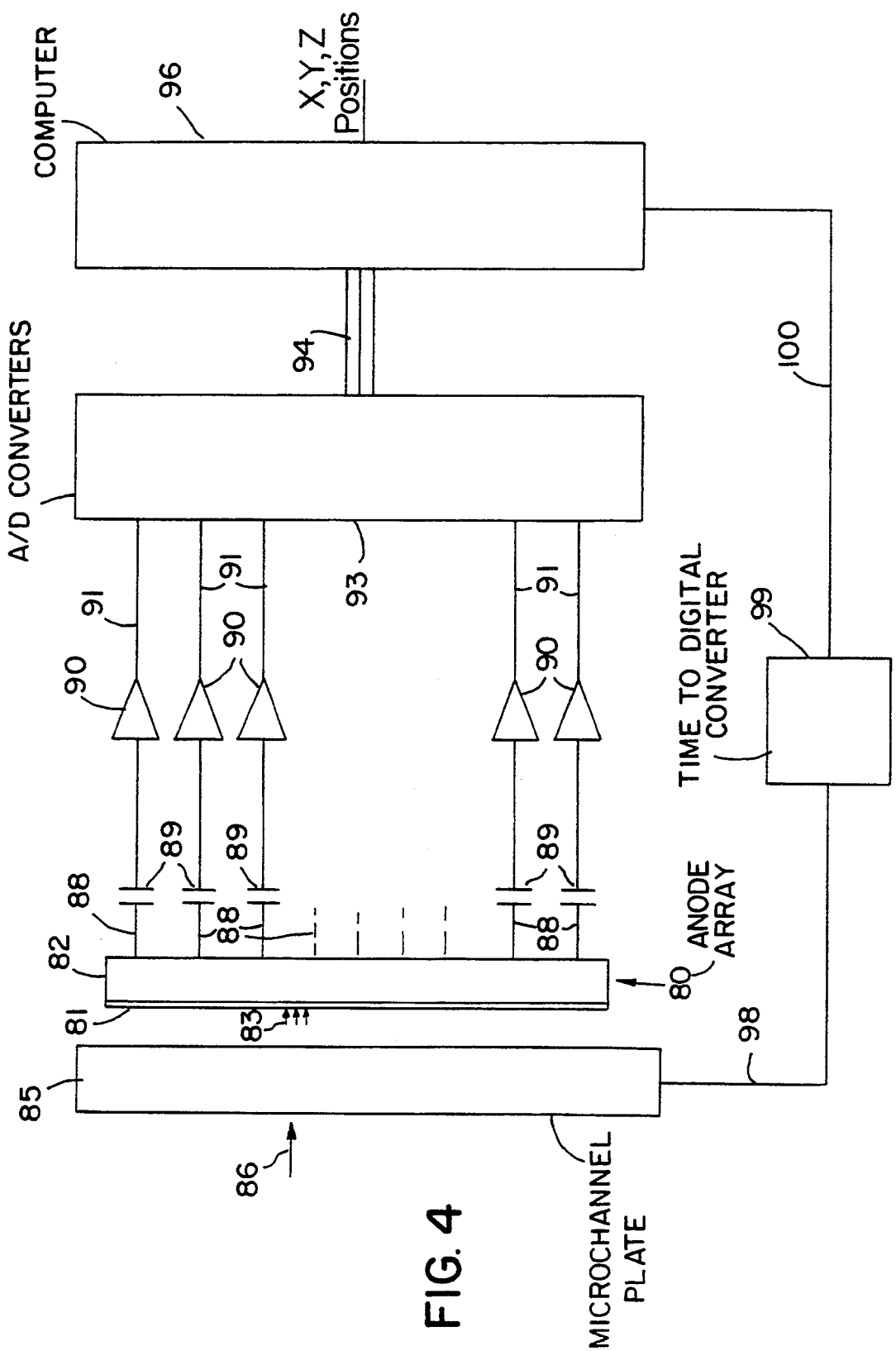
FIG. 4 is a schematic block diagram of a position sensitive detector system in accordance with the invention.

The wedge-and-wedge anodes of the present invention can be utilized, either in a single unit system, or in arrays of multiple units, as position sensitive detectors in a variety of applications. One such application is in a position sensitive atom probe, as exemplified in U.S. Pat. No. 5,061,850, the disclosure of which is incorporated herein by reference. However, it is understood that the detector of the present invention may be utilized in many other applications in which position sensitive detectors are required. An illustrative detector system in accordance with the invention is shown in FIG. 4, and utilizes a wedge-and-wedge anode array 80 having a plurality of anode units 81 formed on a substrate 82, utilizing any of the wedge-and-wedge anode configurations of the present invention as described herein. The anode array 80 detects a charge cloud of incident electrons 83 from a microchannel plate 85 generated in response to an incident event 86, such as an ion or photon contacting the microchannel plate 85. The microchannel plate may be constructed and biased in various ways, for example, as described in the aforesaid U.S. Pat. No. 5,061,850. The microchannel plate converts an event impact into an emitted cloud of electrons correlated to the position of the impact. Other types of converters may also be used, depending on the application of the detector. The charge outputs from the various electrodes are provided on a plurality of output lines 88. The charge signals on the lines 88 are coupled through optional isolation capacitors 89, required if the anode units 81 are at high voltage, to integrating charge amplifiers 90, with one charge amplifier being required for each of the output lines. The signals on the output lines 91 from the charge amplifiers 90 are provided to a bank of analog-to-digital converters 93 which convert the signals on the lines 91, corresponding to the charge received by each of the electrodes, to digital output data on output data bus lines 94 which are connected to a computer 96. A signal from the microchannel plate 85 on a line 98, indicating the detection of an event by the microchannel plate, is provided to a time-to-digital converter 99 which provides output data on a line 100 to supply information on the time of occurrence of the event to the computer 96. The computer 96 then computes the X and Y coordinate positions of the event in accordance with the expressions set forth above and the point in time of the event (which may indicate the "Z" position of the event). If time of flight information is not required then the timing portion of the system may be removed.

Figure 5:
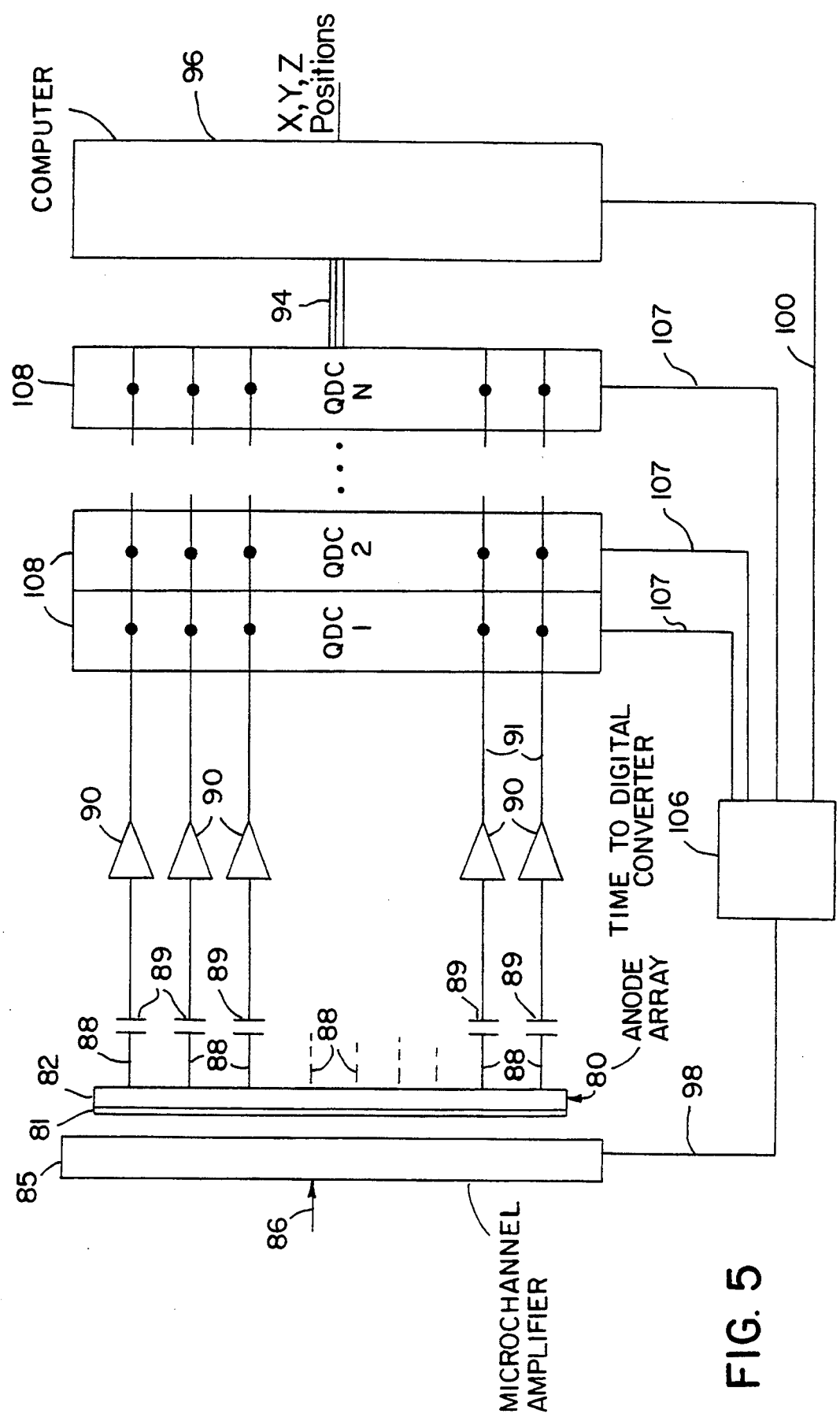
FIG. 5 is a block diagram of a position sensitive detector system in accordance with the invention which allows isochronal mapping of detected simultaneous events.

A variation of the detector configuration which allows isochronal mapping is shown in FIG. 5. In this configuration, a multi-hit time-to-digital converter 106 is used to provide signals on lines 107 to trigger a bank of charge-to-digital converters 108 in consecutive order, as well as supplying the timing information to the computer 96. If time of flight information is not required, each change-to-digital converter 108 can trigger the next charge-to-digital converter 108 in sequence. The charge-to-digital converters 108 are triggered in consecutive order starting with the first one and ending either with the last one or when the detector pulse cycle is complete. For applications where continuous collection is desirable, this can be achieved if the number of charge-to-digital converters is large enough so that the first charge-to-digital converter has completed its conversion cycle and is ready for the next collection cycle before the last charge-to-digital converter has completed its collection cycle. This arrangement allows the cycle frequency of the detector to be increased to thereby increase the data acquisition rate.

The wedge-and-wedge anode units of the present invention can be expanded to multi-anode arrays which have electrodes of a particular type interconnected together in rows and columns and along the diagonals to obtain sufficient output signals to allow the position of an event on the array to be resolved. A smaller number of charge amplifiers 90 and charge converters 93 is required than with arrays of the conventional wedge-and-strip anode. The advantage of the wedge-and-wedge anode over the wedge-and-strip anode is particularly apparent as the size of the array increases. For a single unit of the wedge-and-strip anode or the wedge-and-wedge anode, the wedge-and-strip anode requires three amplifiers and converters whereas the wedge-and-wedge anode requires four. However, for four units of either, the wedge-and-strip anode requires 12 amplifiers and converters whereas the interconnected wedge-and-wedge anode requires only 10, and for an array of 37 anode units, a wedge-and-strip anode array would require 111 amplifiers and converters while an interconnected wedge-and-wedge anode array would require only 32.

Figure 6:
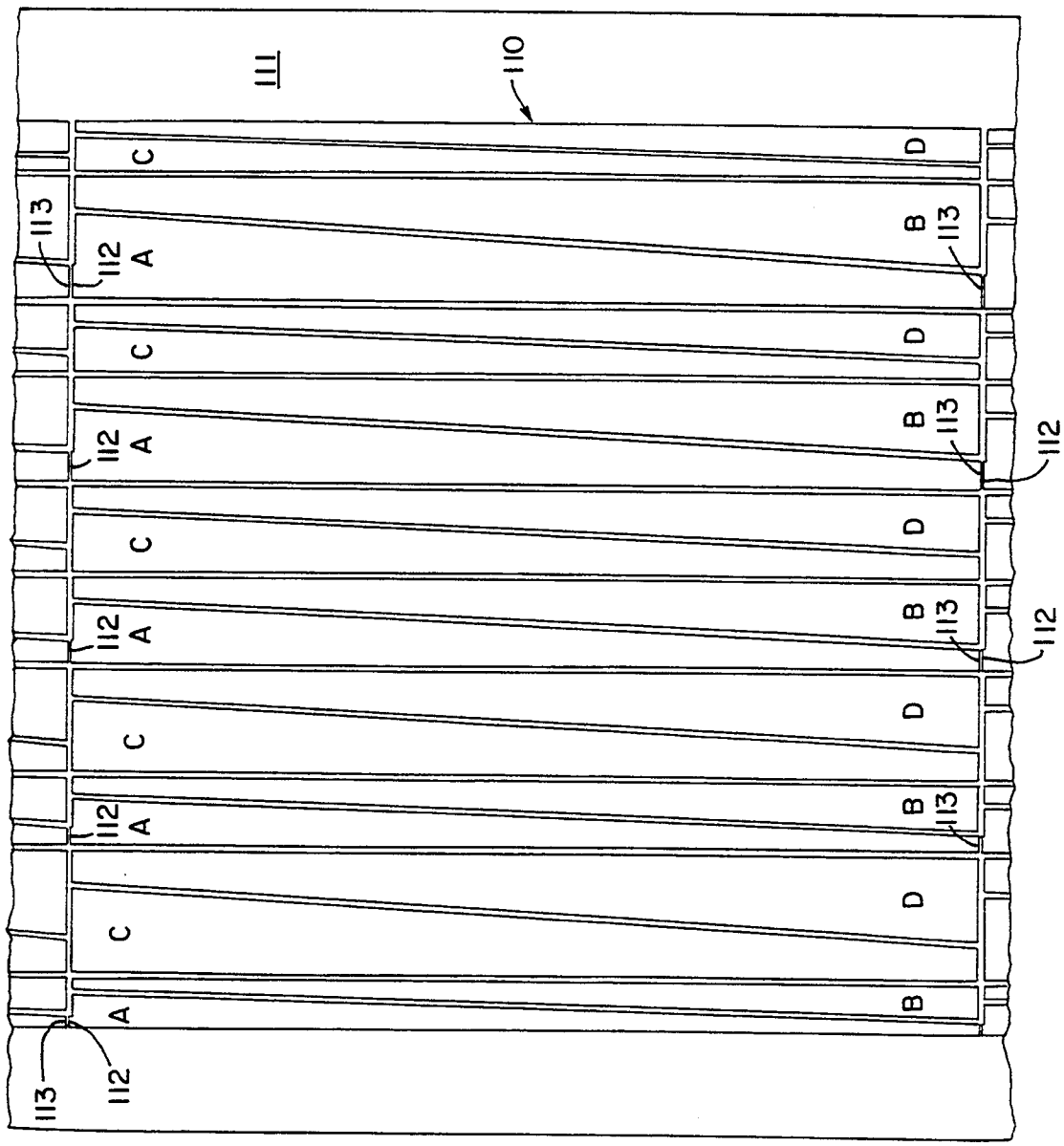
FIG. 6 is a plan view of a portion of a wedge-and-wedge anode array having connection of one type of electrode element on the surface and a multilayer substrate in which subsurface interconnections between the electrode elements of the anode are formed.

An example of a wedge-and-wedge anode pattern which is suited for incorporation in large arrays is shown in FIG. 6 at 110 on a multilayer substrate 111. The wedge-and-wedge anode 110 has the basic wedge shaped electrode configuration of FIG. 1 with truncation of the tips of the electrode elements. Truncation of the tips eliminates regions where the electrode area approaches zero, and thus avoids calculations for X and Y coordinates where the denominator approaches zero. The X and Y coordinate calculations for the position of the event on the anode unit can be carried out using the same expressions as for the anode of FIG. 2. The position of an event on the array can be found with the following expressions:

$$X_{array} = W_x \cdot (I-1) + X$$

$$Y_{array} = W_y \cdot (J-1) + Y$$

where $W_x$ is the width of a single anode unit, $W_y$ is the height of a single anode unit, I is the column number and J is the row number of the anode unit where the event took place, and X and Y are the calculated positions on the anode unit. The A electrode elements have small protrusions 112 at their tops which extend up beyond the top edges of the other electrode elements, and the bottom edges 113 of the A electrode elements extend down below the level of the adjacent electrode elements. In this manner, all of the A electrode elements in a column of electrode elements may be connected together, as the extended bottoms 113 of one level of electrode elements will contact the protrusions 112 at the tops of the next lower level of electrode elements. The A electrode elements may be connected together by a lateral surface conductor at the top and/or bottom row of anodes, similar to the conductive strip 44 of FIG. 2. The A electrode elements may also be connected by conductors extending through vias in the substrate to conductors on a subsurface layer in the same manner as for the other electrode elements as discussed below.

Figure 7:
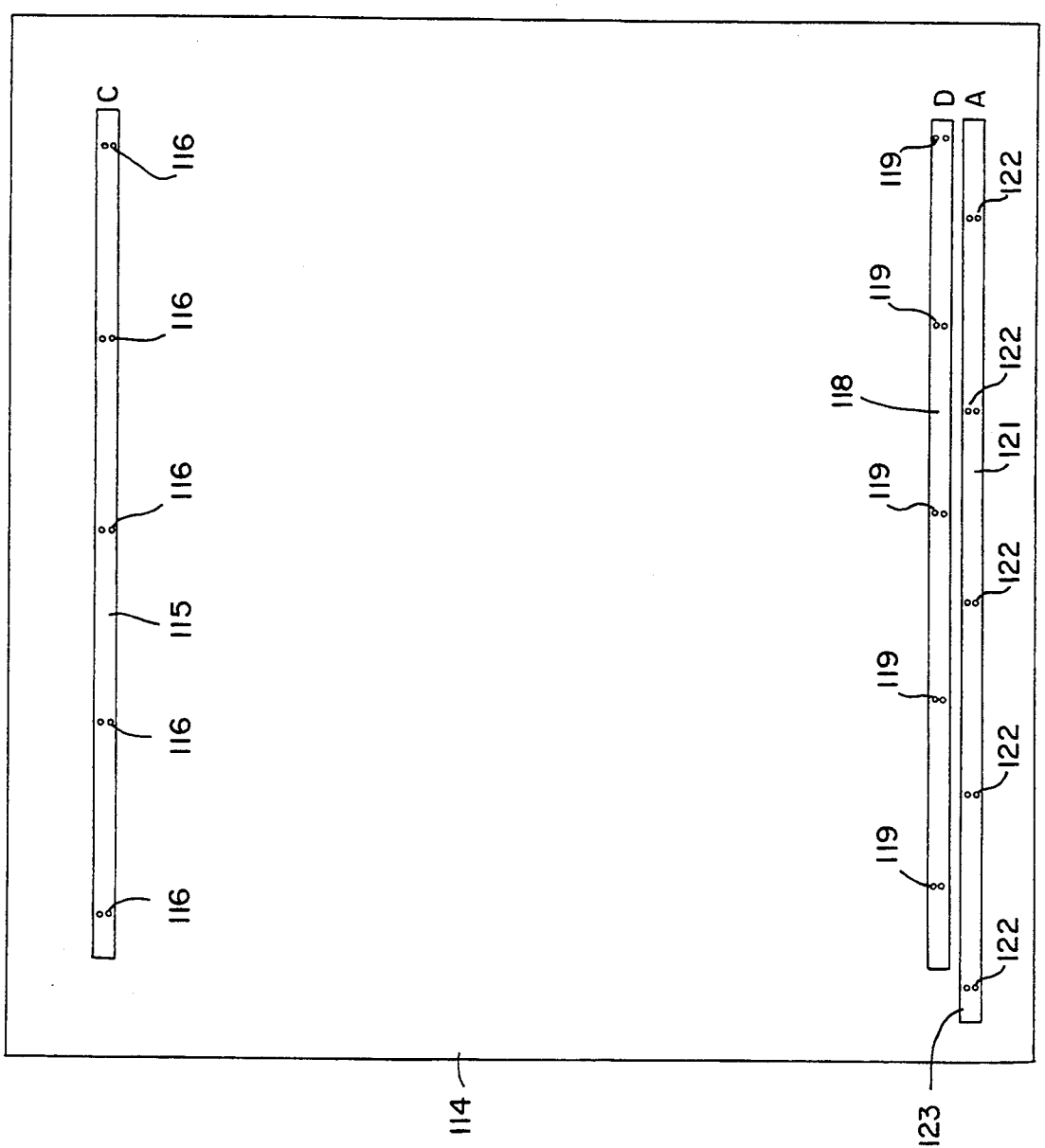
FIGS. 7-9 are plan views of electrical conducting strips and vias formed on sub-layers of the substrate of the anode of FIG. 6.

The substrate has multiple layers with electrical conductors extending through vias in the top layer of the substrate 111 down to conductors formed on a second layer 114 of the substrate, as illustrated in FIG. 7. On the layer 114, a conducting metal strip 115 is formed which extends laterally and which has conductors 116 which extend through vias in the next higher layer of the substrate up to the C electrode elements of FIG. 6. Similarly, a lateral conducting strip 118 is formed on the layer 114 and has conductors 119 which extend through vias in the next higher layer to the D electrode elements. Another lateral conducting strip 121 is formed on the second layer 114 and has conductors 122 which connect through vias in the next higher layer to the B electrode elements. A small extension 123 of the conductor 121 sticks out beyond the strips 115 and 118 to allow the B conductor of each unit 110 to overlap and connect with the B conductors of each of the other wedge-and-wedge anode units in a row of the array.

Figure 8:
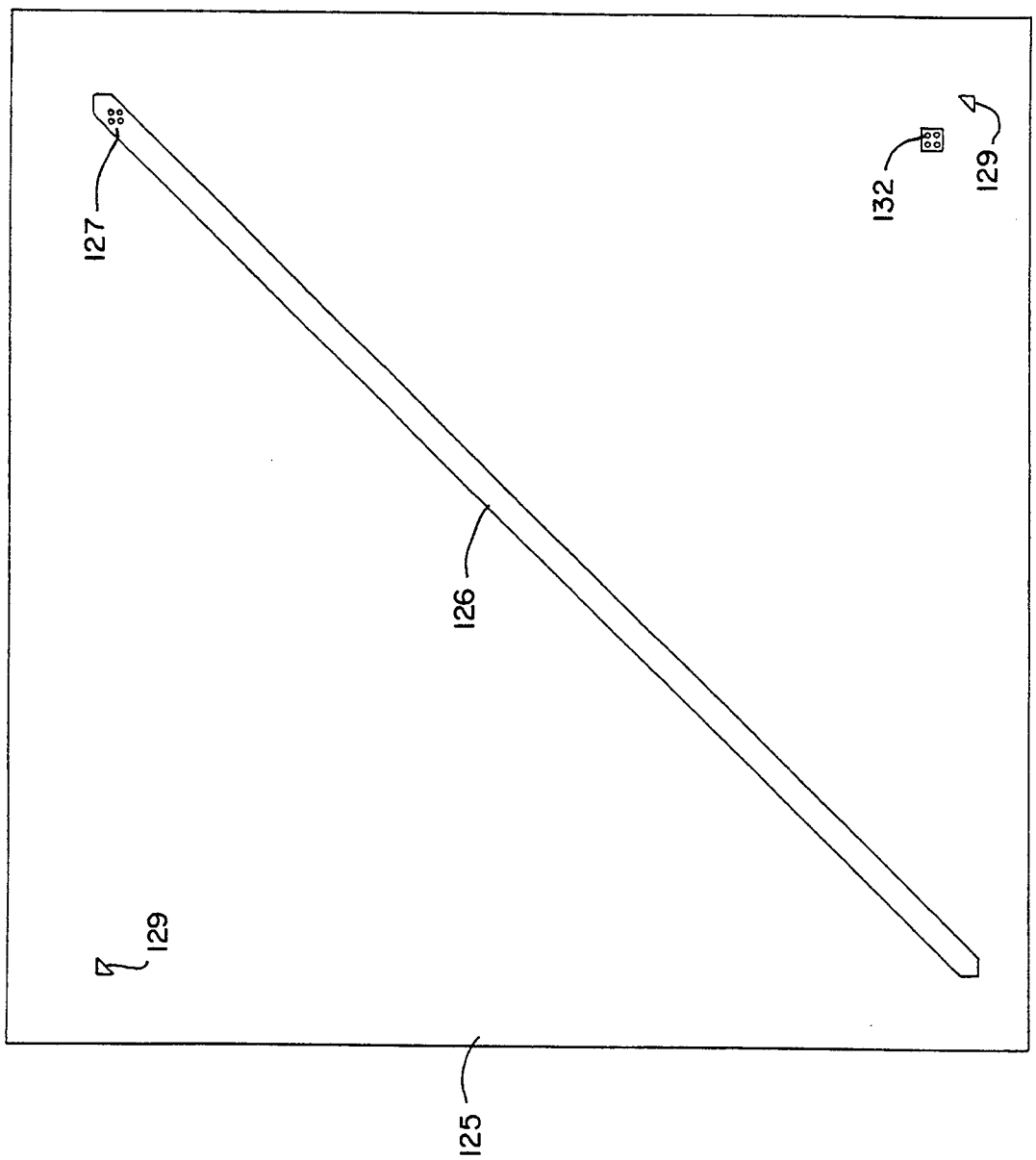

As shown in FIG. 8, a third layer 125 of the substrate has a diagonal conducting strip 126 formed thereon which connects by conductors 127 through vias in the substrate layer 114 to the C conducting strip 115. The C conducting strip 126 overlaps and makes electrical contact with a similar C conducting strip of diagonally adjacent anode units at the right top and left bottom. Small conducting pads 129 are also formed on the substrate layer 125 in position to be contacted by the conducting strips 126 of the conductors for the C electrodes of the adjacent anode units to complete the connection to the C electrode conducting strip for the array. Conductors 132 extend through vias in the substrate layer 114 to the conducting strip 118 which is connected to the D electrode elements.

Figure 9:
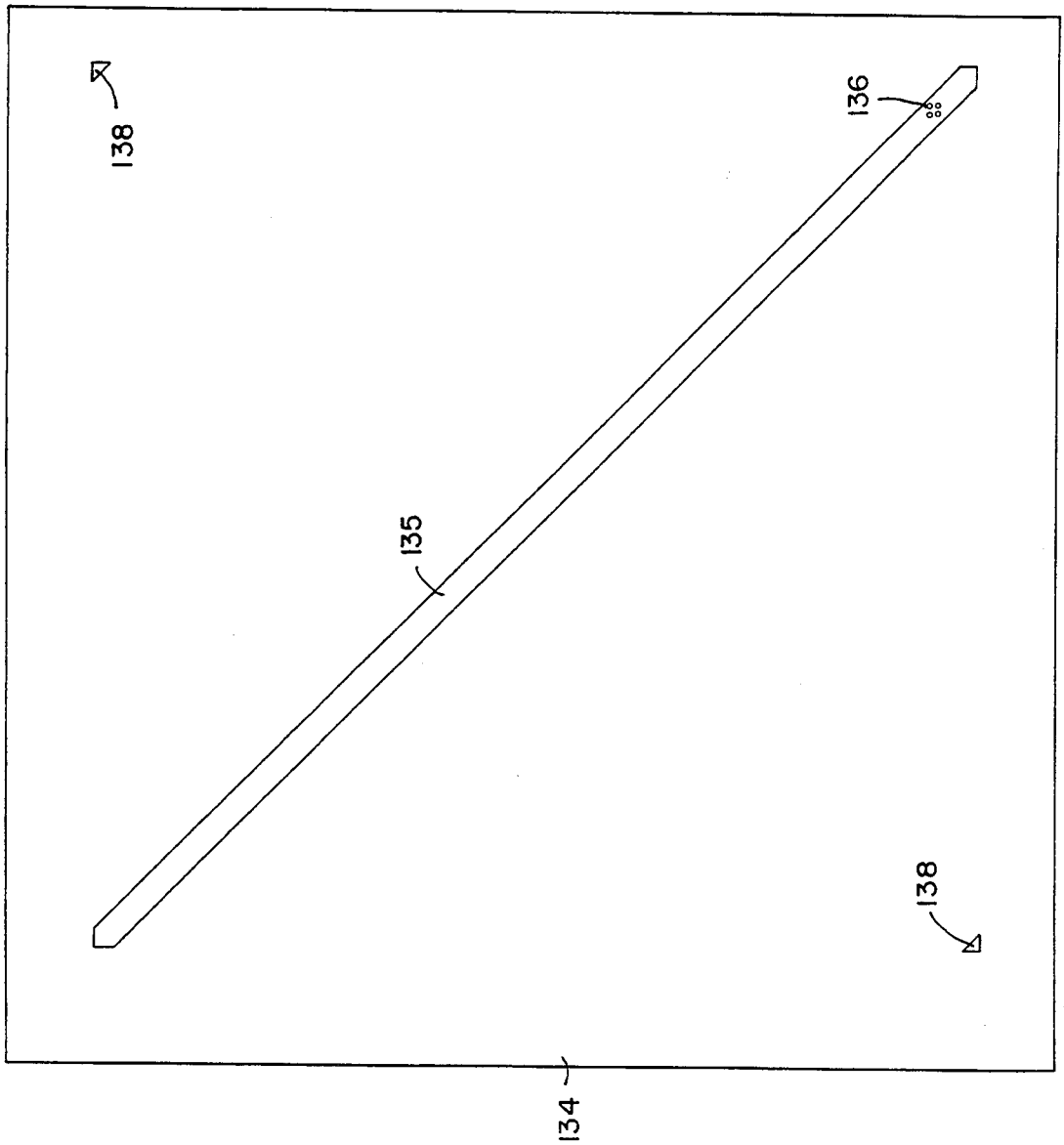

As shown in FIG. 9, a fourth substrate layer 134 has a diagonal conducting strip 135 formed thereon which is connected by conductors 136 which extend through vias in the substrate layer 125 to the conductors 132 and thence to all of the D electrode elements on the anode unit. The conducting strip 135 connects electrically to the D conducting strips 135 of diagonally adjacent anode units at the top left and right bottom. Conducting pads 138 are formed at the corners of the sublayer 134 to complete the electrical connection between the diagonal conductors 135 of the diagonally adjacent anode units.

Figure 10:
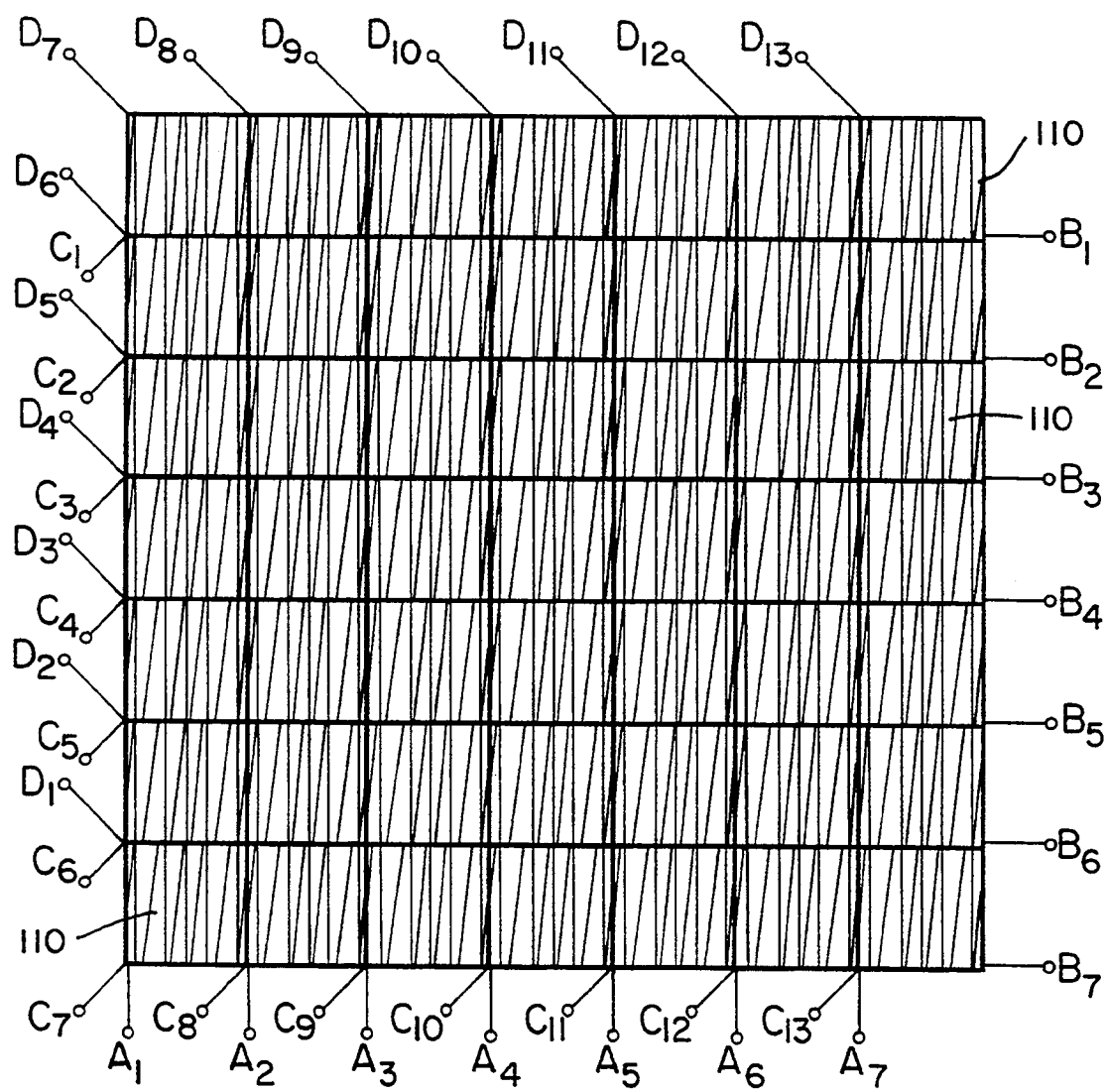
FIG. 10 is a plan view of an array of wedge and wedge anode units which may be interconnected to provide detection of simultaneous events over a wide area.

An exemplary 7×7 rectangular array of the units 110 arranged in adjacent rows and columns is illustrated in FIG. 10. The units 110 may be formed on a single unitary substrate 111, or the units may be formed on separated substrates which are then interconnected. As shown in this figure, the total electrical signal connections to the array include 7 A electrode connections, 7 B electrode connections, 13 C electrode connections, and 13 D electrode connections, for a total of 40 connections. Thus, 40 integrating charge amplifiers and converters are required. For a similar 7×7 array of wedge-and-strip anodes, 147 connections and 147 integrating charge amplifiers and converters would be required.

Figure 11:
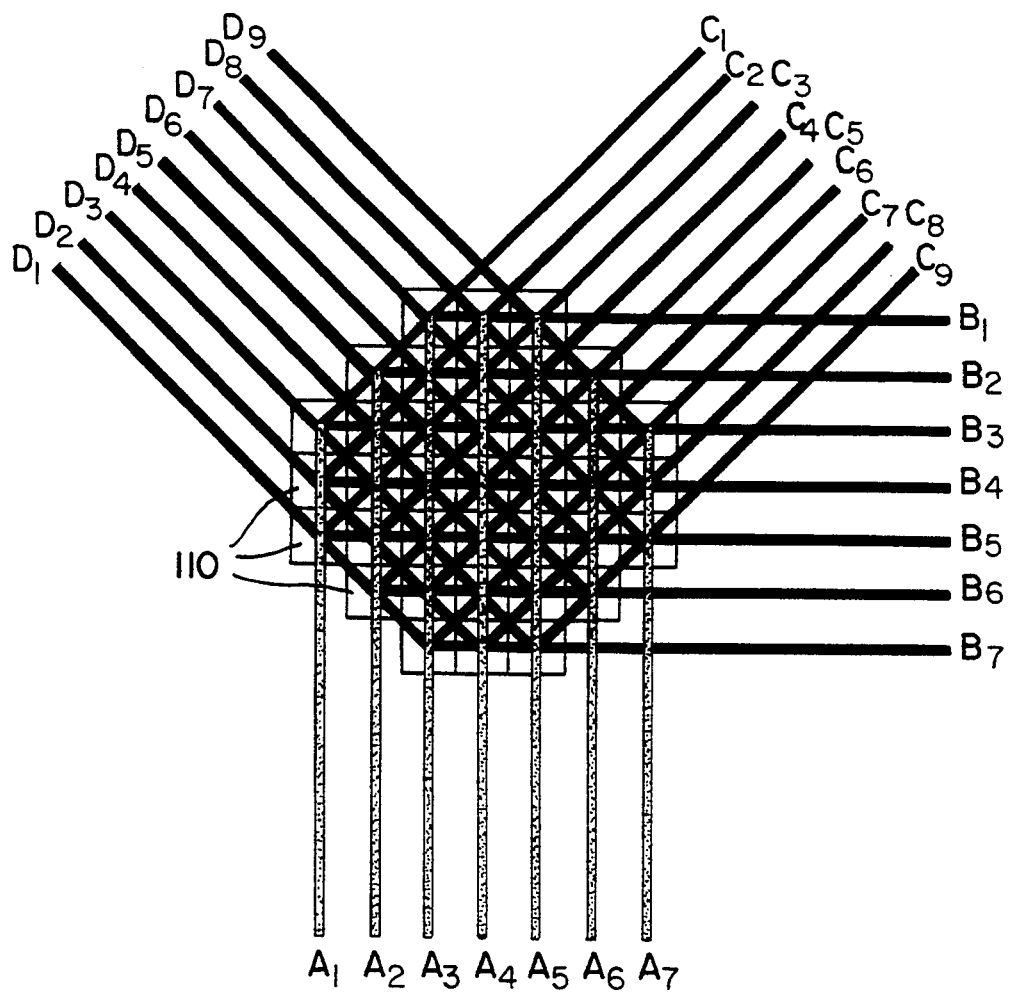
FIG. 11 is an illustrative schematic view showing the manner in which an array of wedge and wedge anode units may be electrically interconnected to cover approximately a circular region.

FIG. 11 illustrates a modified array of the units 110 which is less than a full 7×7 array. The units at the corners are deleted to provide an array of 37 anode units 110 which has approximately circular coverage. By doing so, the need for four integrating charge amplifier and converter circuits for both the C and D electrodes (a total of eight circuits) is eliminated. It is seen that only 32 signal leads are required for this array, whereas a similar noninterconnected array of conventional wedge-and-strip anodes would require 111 signal leads (and integrating charge amplifiers).

Figure 12:
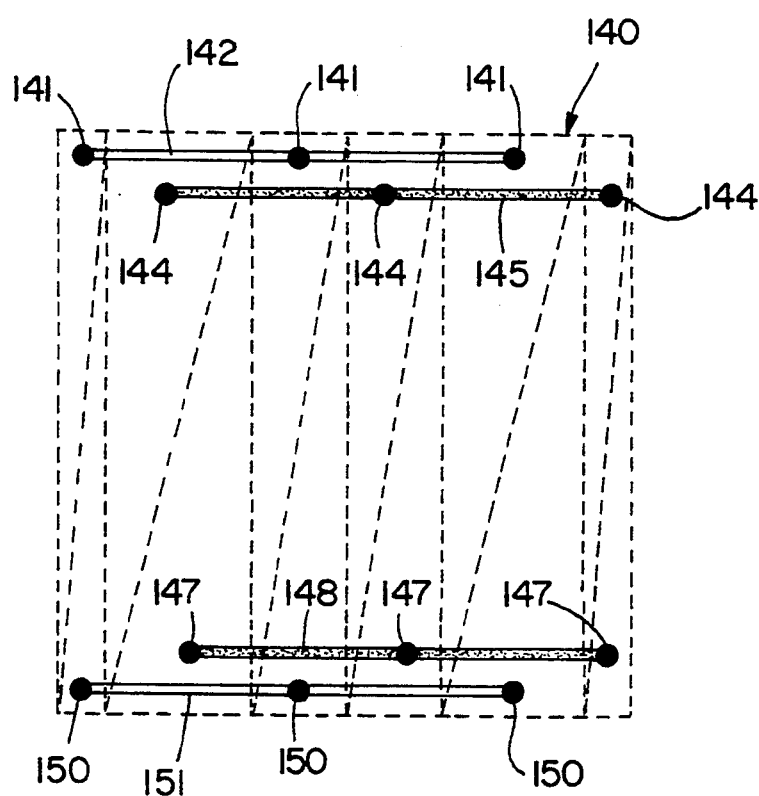
FIG. 12 is an illustrative plan view of electrical connections on a subsurface layer of the wedge-and-wedge anode structure of FIG. 1.

The interconnection of electrode elements in a multilayer structure as described above with respect to FIGS. 6–9 is one possible way of connecting the electrodes, but other ways utilizing multilayer substrates are also feasible. An illustrative example of another type of multilayer subsurface connection arrangement is illustrated in FIG. 12, which shows a subsurface layer 140 with connections thereon for connecting the electrode elements of a single wedge-and-wedge anode unit as illustrated, for example, in FIG. 1. The dashed lines in FIG. 12 illustrate the position of the electrode elements on the top surface of the anode. Electrical conductors 141 extend through vias in the top layer of the substrate to the surface of the sublayer 140 where they are connected together by a conductive strip 142, electrically connecting together all of the A electrode elements. Similarly, conductors 144 extend through vias in the top surface to a conductive strip 145 to connect together all of the C electrode elements, conductors 147 extend through vias in the top surface to a conductive strip 148 on the surface of the sublayer 140 to connect together all of the D electrode elements, and conductors 150 extend through vias in the top layer to a conductive strip 151 on the surface of the sublayer 140 to connect together all of the B electrode elements. Stub conductors (not shown) can be connected to each of the conducting strips 142, 145, 148 and 151 to provide electrical connections to each of the A, B, C and D electrodes. Such a structure avoids requiring any interconnection of electrodes on the top surface.

Figure 13:
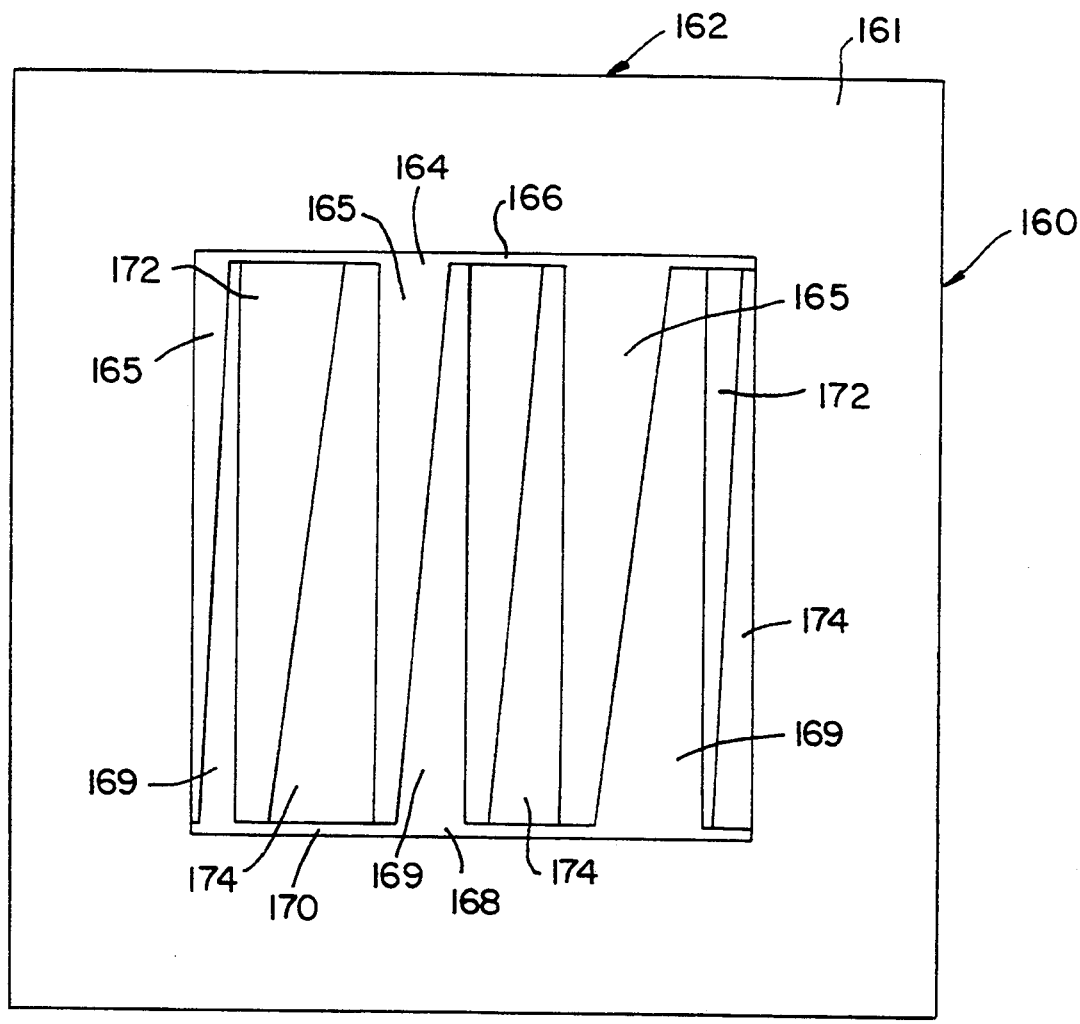
FIG. 13 is an illustrative plan view of the electrodes on the surface of another wedge-and-wedge anode in which two types of electrode elements are connected on the surface.
Figure 14:
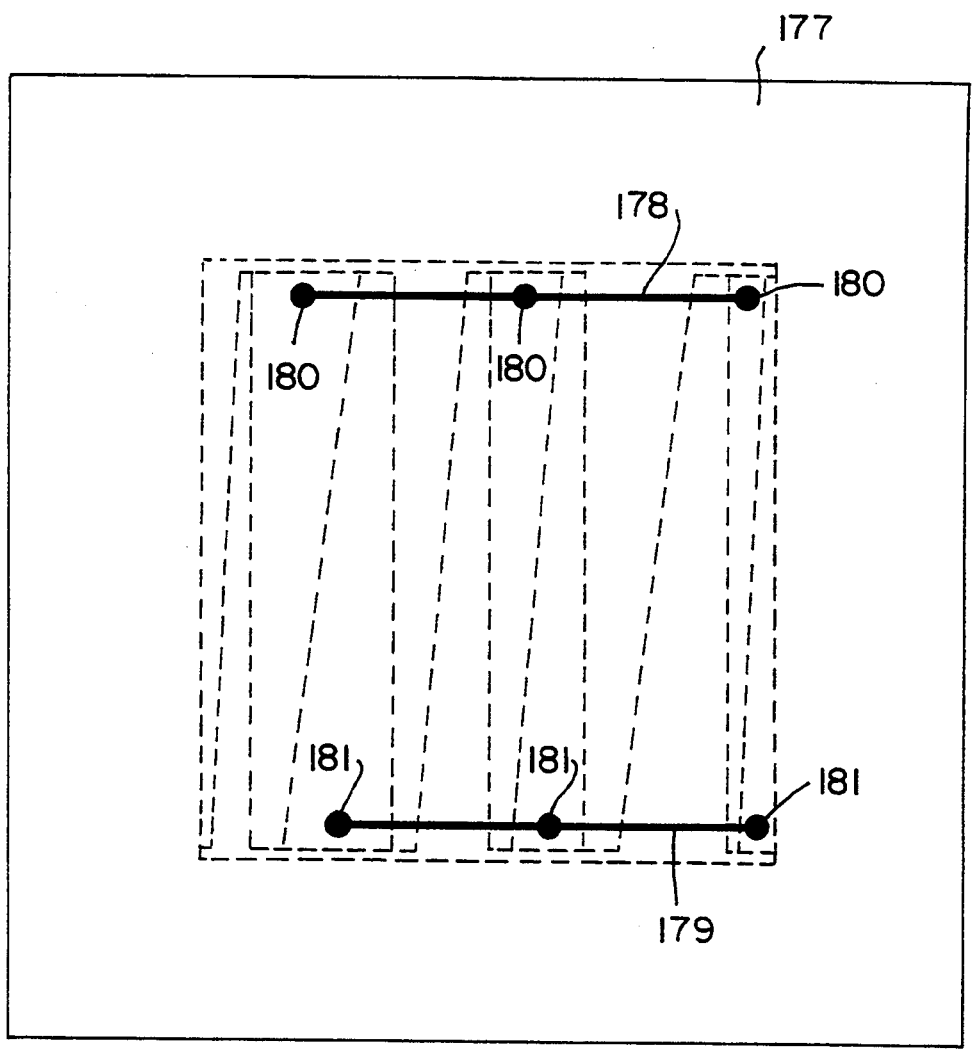
FIG. 14 is an illustrative view of the electrical connections on the subsurface layer of the anode of FIG. 13.

Another interconnection scheme for a single wedge-and-wedge anode unit is illustrated in FIGS. 13 and 14. The electrode unit 160 is formed on the top surface 161 of a multilayer substrate 162, and has an A electrode 164 with wedge shaped electrode elements 165 which are interconnected by a conducting strip 166 extending across the top of the electrode elements. The B electrode 168 has wedge-shaped electrode elements 169 connected by a conductive strip 170 extending along the bottom of the electrode elements 169. The C electrode elements 172 and the D electrode elements 174 are formed as separated wedge shaped elements on the surface 161 of the multilayer substrate 162.

As shown in FIG. 14, a subsurface layer 176 of the substrate 162 has a surface 177 on which are formed conductive strips 178 and 179. Conductors 180 extend through vias in the first surface layer 161 to connect the C electrode elements 172 to the conductive strip 178, thereby electrically connecting all of the electrode elements together to form the C electrode. Similarly, conductors 181 extend through vias in the first surface layer 161 to connect the D electrode elements 174 to the conductive strip 179, thereby connecting all of these elements together to form the D electrode. Conducting stubs (not shown) may then be formed to extend to the conductive strips 178 and 179 to provide connections to external circuitry.

Figure 15:
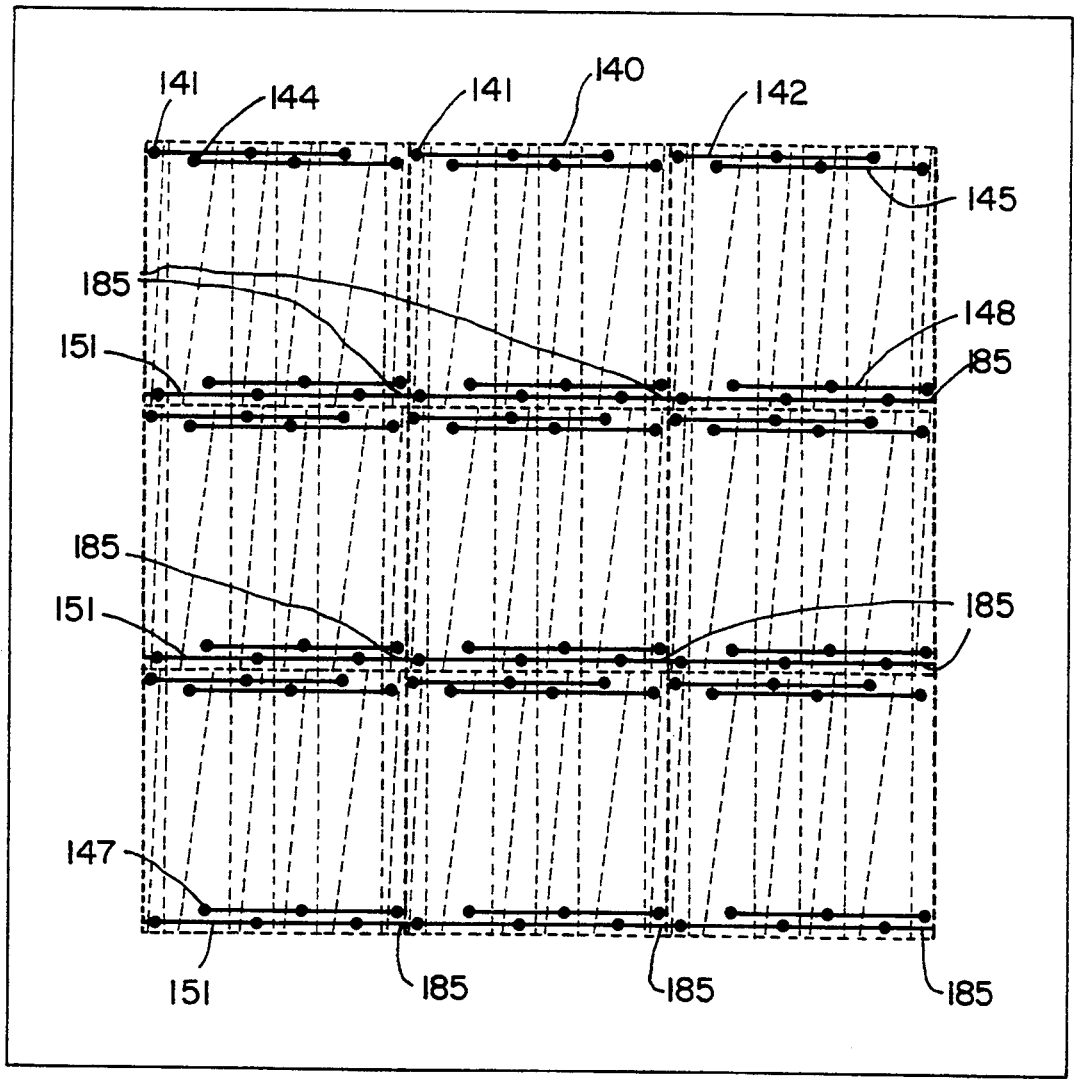
FIG. 15 is an illustrative view of the electrical connection on a first subsurface layer for an exemplary array of anode units.
Figure 16:
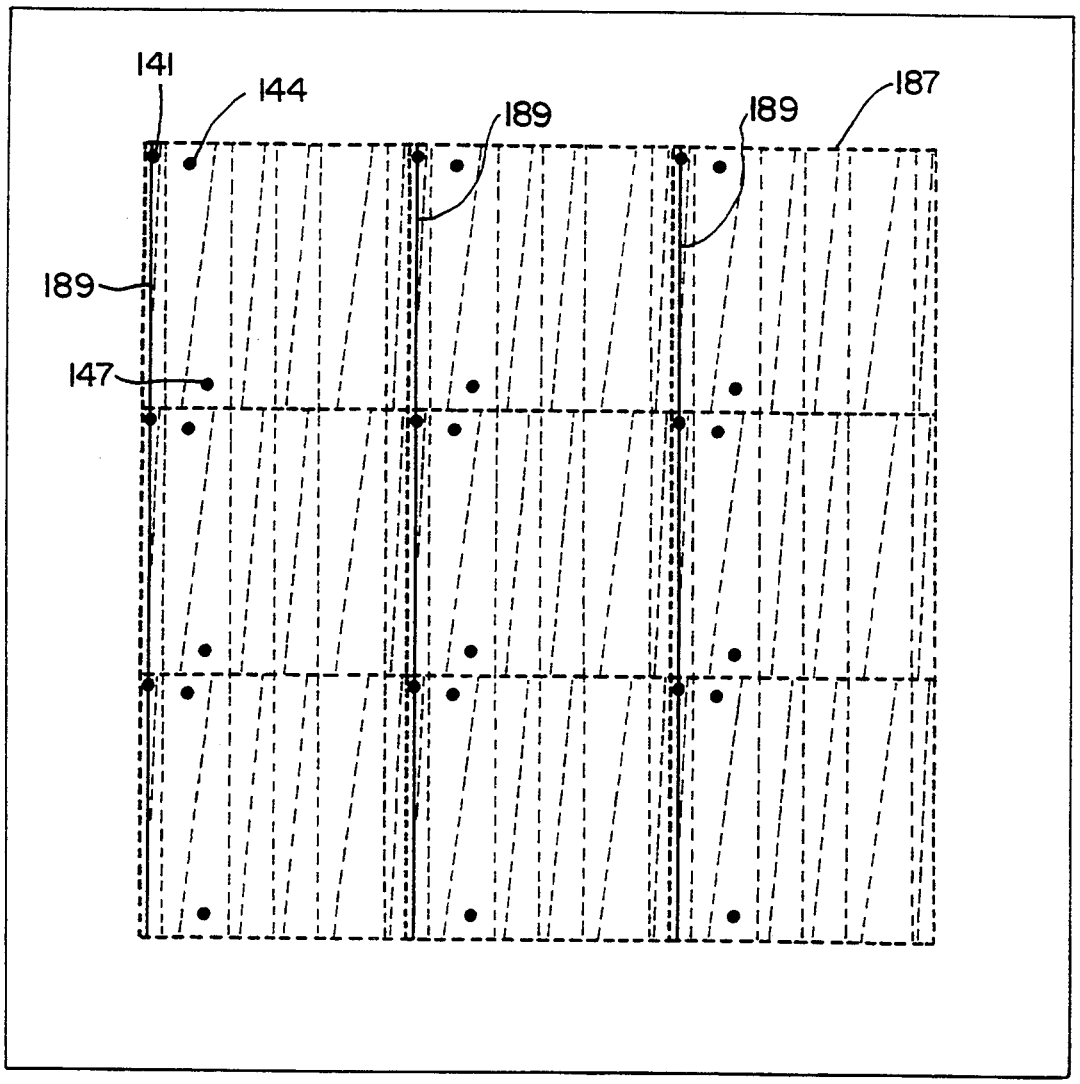
FIG. 16 is an illustrative view of the electrical connections on the second subsurface layer for the array of FIG. 15.

The sublayer connections of FIG. 12 may further be extended to arrays of anode units 140, in the manner illustrated in FIGS. 15–18. FIG. 15 shows a series of substrates 140 for anode units of the type shown in FIG. 12 in which the conductive strips 151 are connected by extension strips 185 to provide electrical connection of all of the B electrodes in each of the rows of the anode array. The end conductors 141, 144 and 147 extend through to a second subsurface layer 187 where all of the conductors 141 which are connected to the A electrode elements are connected together by conductive strip 189 in each of the columns of the anode array, as shown in FIG. 16.

Figure 17:
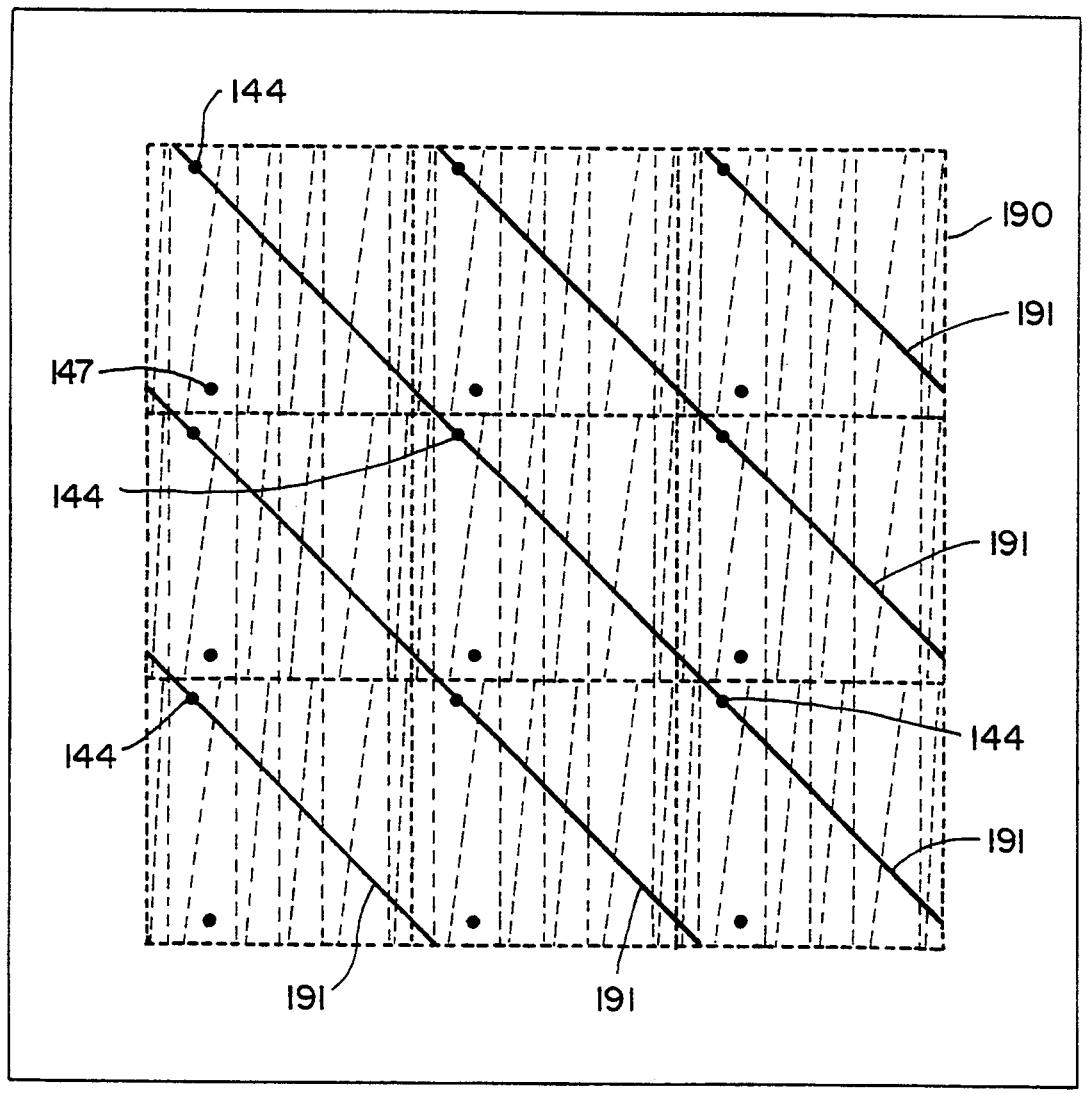
FIG. 17 is an illustrative view of the electrical connections on the third subsurface layer for the array of FIG. 15.

The conductors 144 and 147 extend downwardly through the second subsurface layer 187 to a third subsurface layer 190 where all of the conductors 144, connected to the C electrodes, are connected together by diagonal conducting strips 191, as shown in FIG. 17.

Figure 18:
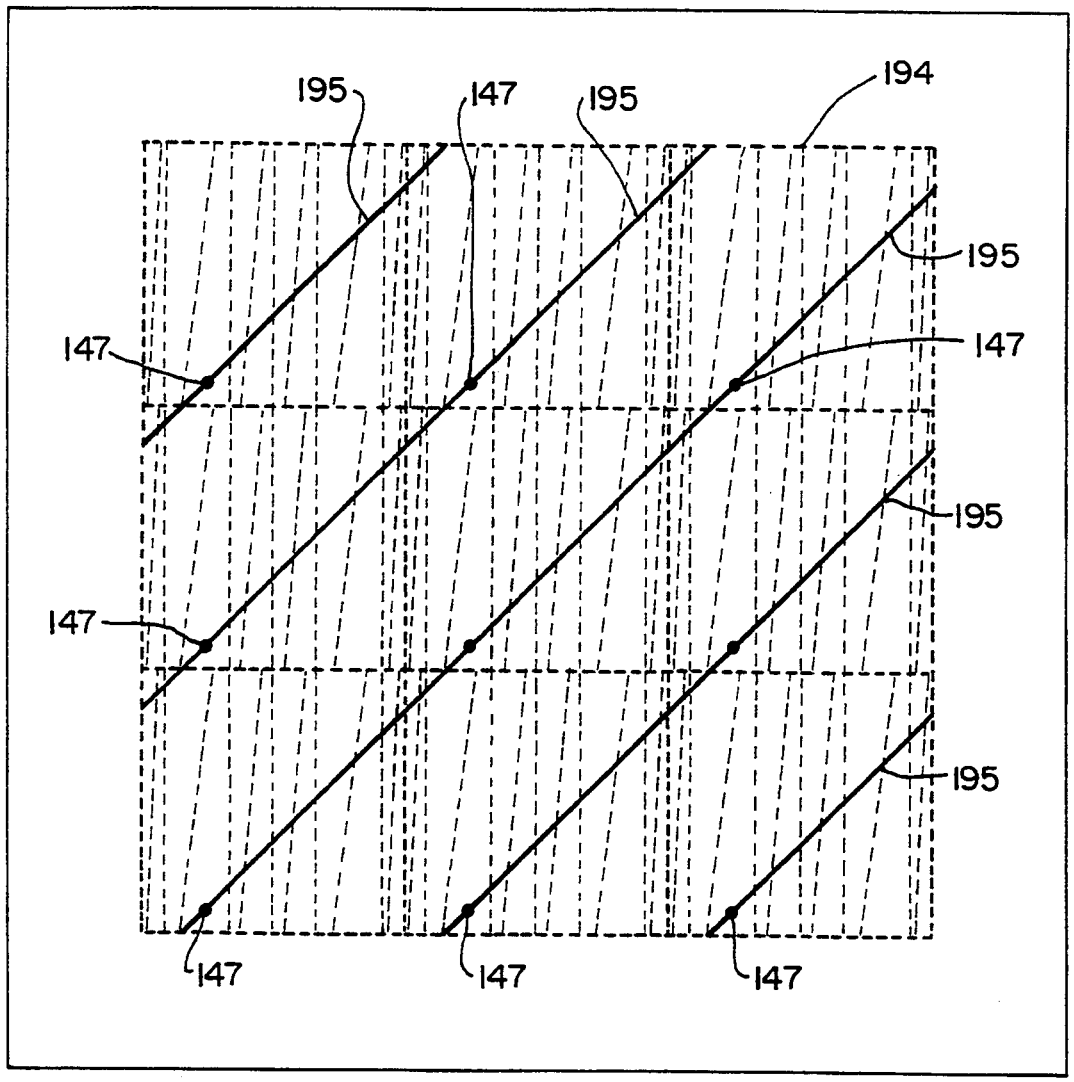
FIG. 18 is an illustrative view of the electrical connections on the fourth subsurface layer for the array of FIG. 15.

The conductors 147 further extend through vias in the third subsurface layer 190 to a fourth subsurface layer 194 where each of the conductors 147, connected to the D electrodes, are electrically connected by conducting strips 195 along diagonals of the array of anode elements as illustrated in FIG. 18. The conductive strips 195 extend along the diagonals which are at right angles or opposite to the diagonals along which the conductive strips 191 of FIG. 17 are oriented.

As discussed above, the calculations of the X and Y positions (and the "Z" position or time of event) are determined by processing the information from the various wedge-and-wedge anode units in the computer 96, which may be a conventional microcomputer. The wedge-and-wedge position sensitive detector system of the invention incorporating the computer 96, will measure the positions of individual events occurring on a detector which includes an array of anode units during an "exposure period", which is the time period over which the events that take place are detected. Following the "exposure period", the charge on the detector electrodes will be collected and measured during a "collection period". Calculation of the position of the events then takes place in the computer 96 during a "processing period". It should be noted that the next exposure period may start as soon as the collection period is complete, and these periods are independent of the processing period. For example, if the data from the collection period is stored, processing may take place for many exposure and collection cycles of the detector at a later time or as part of a normal operation cycle for the computer 96.

Figure 19:
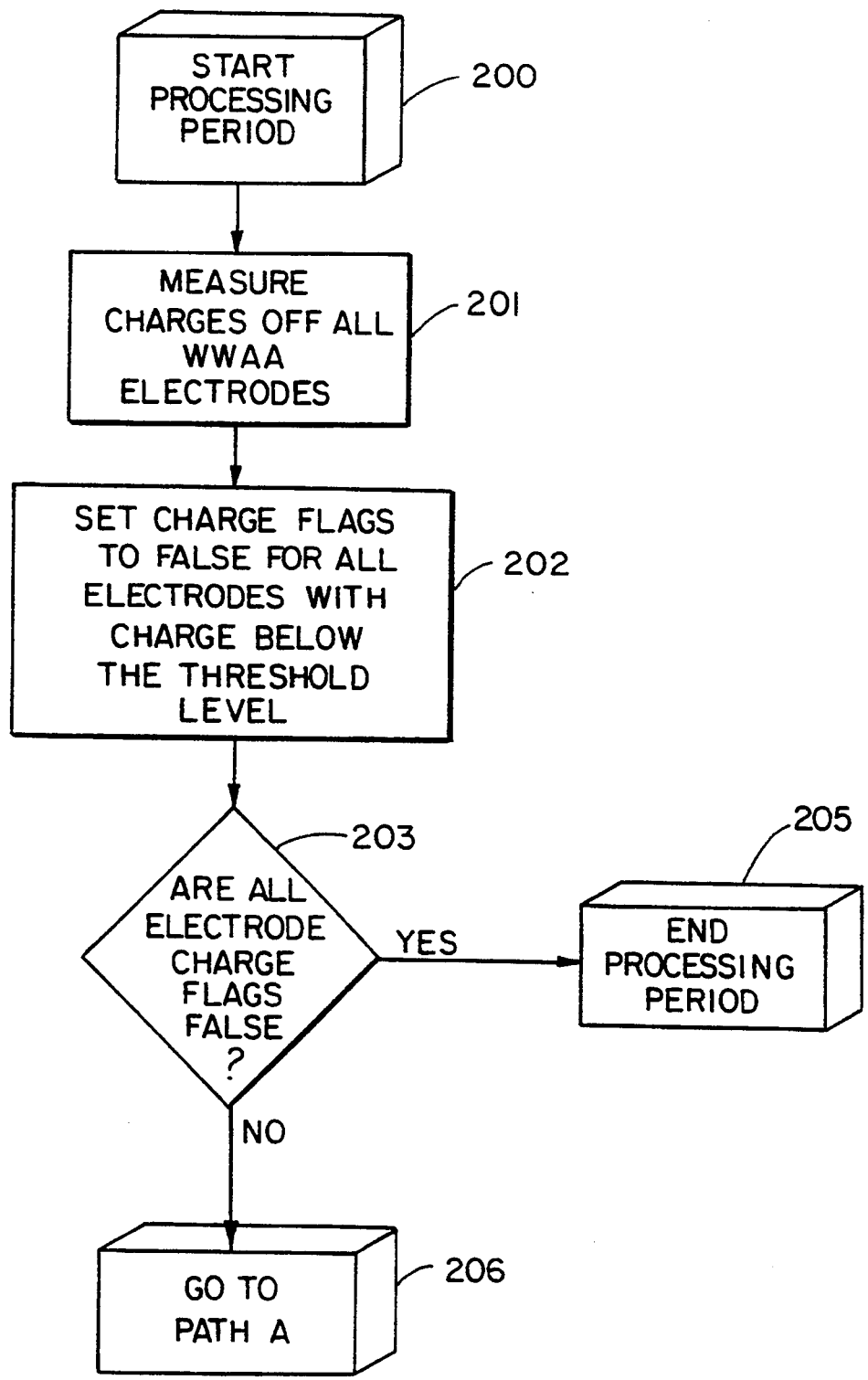
FIGS. 19-21 are flow charts illustrating the processing carried out in the computer of the detector system of the invention to determine the position of one or more events occurring on a detector array.
Figure 20:
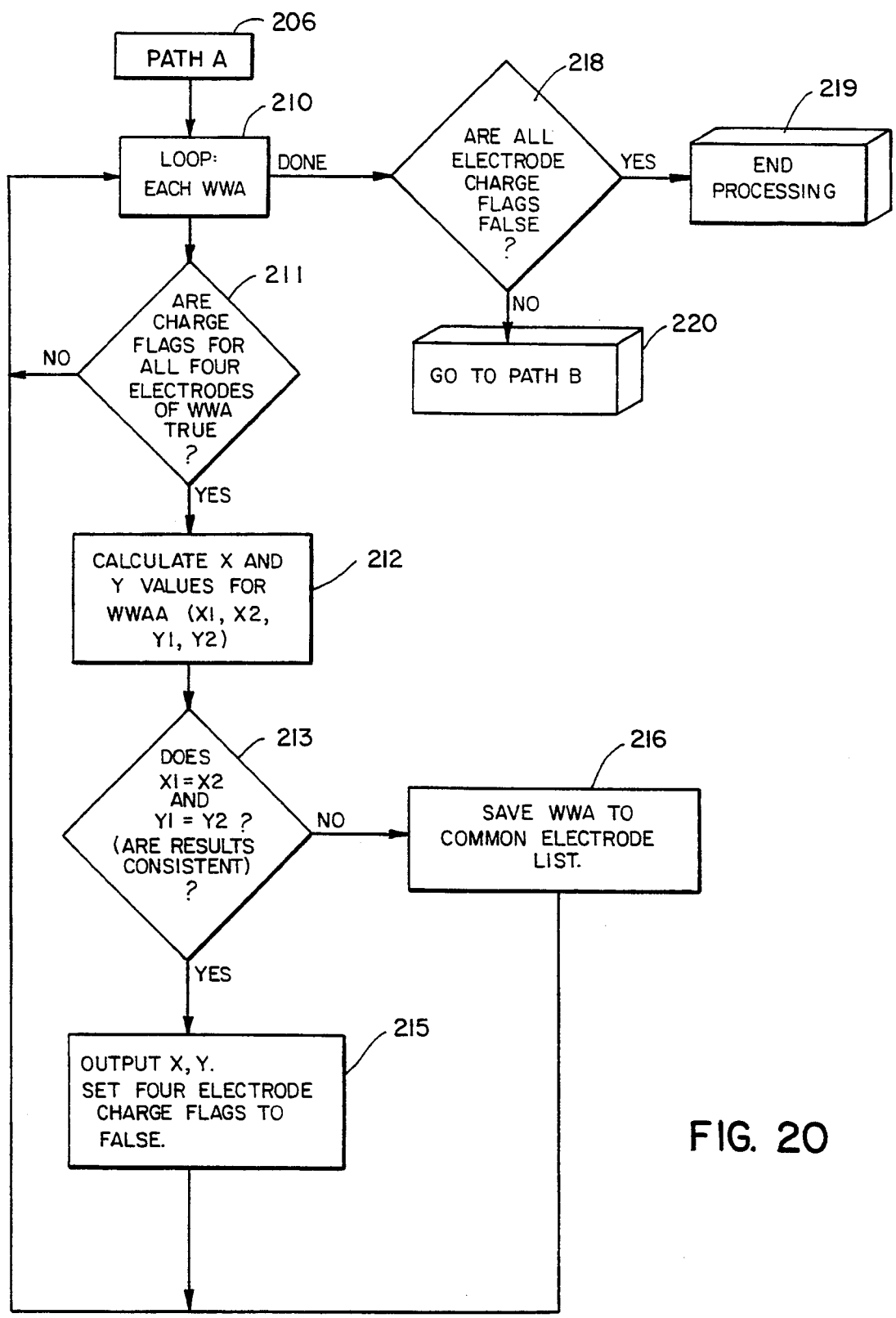
Figure 21:
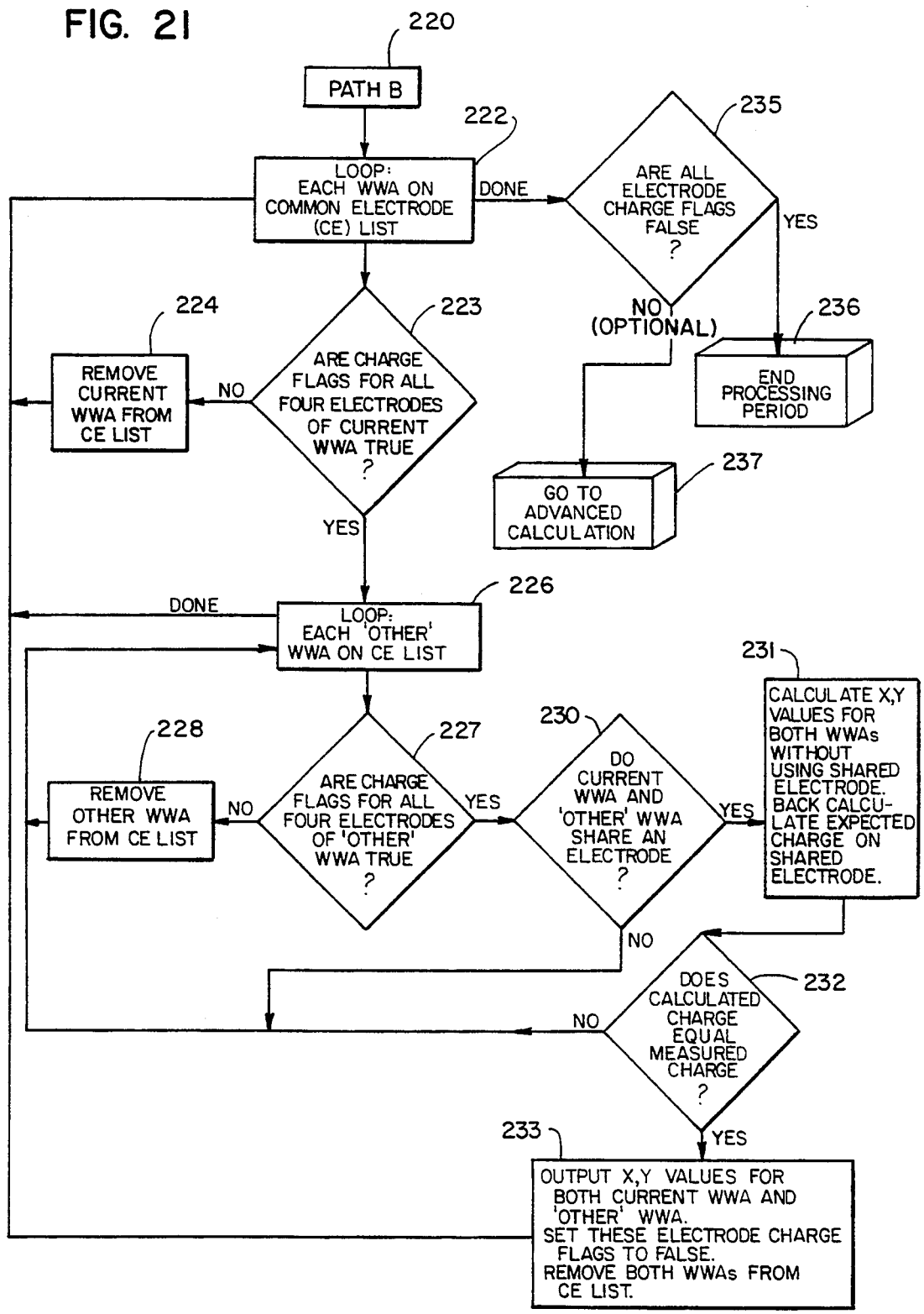

An exemplary processing sequence carried out by the computer 96 under the control of the programming for the computer is illustrated in the flow charts of FIGS. 19–21. This processing sequence is suitable for calculating the position of an event in an array of anode units such as illustrated in FIG. 10, where each anode unit provides four signals, and wherein the electrodes within each anode unit are connected in the array with one set of electrodes connected along the rows, another along the columns, and the other two along the opposite diagonals of the array.

The computer 96 enters the start of the processing period, as illustrated at 200 in FIG. 19, after the "exposure period" and the "collection period" have occurred, although as noted above, many exposure and collection periods may take place before the processing period begins. If the processing period is beginning after each collection period, the first step is the measurement of the charges off of all of the wedge-and-wedge anode array electrodes at 201; if the processing is delayed, this measurement step is carried out after each of the collection periods during which the measured charges are stored for later processing. After completion of the measurement (or retrieval of the measurement data from memory) for each set of measurements, charge flags are set to false for all electrodes with a charge below a selected threshold level at 202, and then the program determines whether all electrode charge flags are false at 203. If yes, the processing period is ended at 205; if not, the program proceeds to processing path A, block 206, which is shown in FIG. 20.

Processing path A carries out a check of each wedge-and-wedge anode unit to determine whether an event may have taken place (all electrode charges are non-zero), and whether another event may have taken place either on the same wedge-and-wedge anode unit or on another wedge-and-wedge anode unit sharing a common electrode connection with the wedge-and-wedge anode unit being evaluated. If the electrode charges are not all non-zero, thereby indicating that no event has taken place, no action is taken with respect to the charge measured for that particular wedge-and-wedge anode unit. However, if an event is detected, then X and Y coordinates are calculated for that particular anode unit to determine the position of the event. If, however, the results are not consistent, indicating that another event may have taken place on either the same anode unit or on other anode units sharing a common electrode lead, that wedge-and-wedge anode unit's position is saved to a common electrode list and no further processing on that anode unit is carried out in path A. If the results of path A indicate that there are multiple events in a single wedge-and-wedge anode unit or that a common electrode is shared by anode units in which events took place, the program then proceeds to path B of FIG. 21.

More specifically, with respect to path A as illustrated in FIG. 20, upon entering the path, the program begins a loop at 210 to evaluate each wedge-and-wedge anode unit. For that unit, the charge data is first checked to determine if charge flags for all four electrodes of the wedge-and-wedge anode have been set true, at 211. If yes, the X and Y values for the wedge-and-wedge anode are calculated at 212 in accordance with the expressions given above. If the charge flags are not all true for that anode unit at 211 (no event on that anode unit), the program loops back to 210 to evaluate another anode unit.

After calculation of the redundant X and Y values at 212, the program checks to determine whether the two values calculated for X and the two values calculated for Y are consistent at 213. If not, the program saves that anode at 216 to the common electrode list and returns to point 210 to get data on the next anode unit. If the results are consistent at 213, the X and Y values are outputted at 215 and the four electrode charge flags for the wedge-and-wedge anode unit are set false before the program moves back to point 210 to evaluate another anode unit.

After completion of evaluation of all anode units at the loop 210, the program then proceeds to determine if all electrode charge flags are false at 218. If so, processing is ended at 219; if not, the program proceeds to path B at 220.

The processing in path B checks the data from the wedge-and-wedge anode units on the common electrode list developed in path A to determine whether an event may have taken place (i.e., whether electrode flags may have been set to zero in path A, eliminating the possibility that an event took place with respect to the wedge-and-wedge anode under evaluation), whether any other wedge-and-wedge anode unit on the common electrode list shares a common electrode with the wedge-and-wedge anode unit under evaluation, and, whether, if another wedge-and-wedge anode unit is found to share a common electrode, the charge on all of the interconnected electrodes of the two wedge-and-wedge anode units is consistent with events occurring on the two anode units. This processing thus finds pairs of events which take place on anode units that share a common electrode. Optionally, data from multiple events on a single wedge-and-wedge anode unit and from three or more wedge-and-wedge anode units which have experienced an event and which share common electrodes either may be ignored, and the data discarded, or be evaluated with optional further processing.

Referring specifically to FIG. 21, upon entry of the B path via 220, the program begins a loop to evaluate each wedge-and-wedge anode unit on the common electrode list at 222. Before evaluating a particular unit, the program first checks to determine whether all charge flags for all four electrodes of the current wedge-and-wedge unit are true, at 223, and if not, the wedge-and-wedge anode unit under evaluation is removed from the common electrode list at 224, and the program returns to the point 222 to evaluate another wedge-and-wedge anode unit. If all of the charge flags are true at 223, the program then enters a loop at 226 to evaluate each of the other wedge-and-wedge anode units on the common electrode list. The program first checks to determine whether the charge flags for all four electrodes of one of the other wedge-and-wedge anode units is true at 227, and, if not, that anode unit is removed from the common electrode list at 228 and the program returns to 226 to evaluate another anode unit. This process continues for the other wedge-and-wedge anode units on the list. If at the decision point 227 an anode unit is found where the charge flags for all four electrodes are true, the program proceeds at 230 to determine whether the current wedge-and-wedge anode unit and the other wedge-and-wedge anode unit just found share an electrode. If not, the program proceeds back to 226 to continue the loop.

If the two anode units are found to share an electrode at 230, the program proceeds at 231 to calculate the X and Y values for both wedge-and-wedge anode units without using the shared electrodes. The program then proceeds to back-calculate the expected charge on the shared electrode from this data. The program then checks at 232 to determine whether the calculated charge equals the measured charge. If not, the data from the two anode units is suspect, and the program returns to a point 226 to continue the loop to look at other wedge-and-wedge anode units. If the calculated charge equals a measured charge at 232, the program proceeds to output the X and Y values for the currently evaluated wedge-and-wedge anode unit and the other wedge-and-wedge anode unit, and the electrode charge flags for both units is set to false and both units are removed from the common electrode list before the program returns to the point 222 to continue the loop.

The program also returns to the point 222 when sufficient loops are completed at the point 226 so that evaluation of each wedge-and-wedge anode unit on the common electrode list is completed.

When all wedge-and-wedge anode units on the common electrode list are evaluated at 222, the program then determines at 235 whether all the electrode charge flags are false. If yes, the processing period is ended at 236; if no, the program may either end processing and ignore data from the anode units which do not then have all the electrode charge flags false, or optionally the program may proceed with the further calculation at 237 to determine the position of events which have occurred on three or more connected anode units. If the optional calculation is performed, the raw data (information from electrodes which are non-zero) remaining following the calculations carried out in path B will consist of, first, two or more events occurring on a single wedge-and-wedge anode unit. In this case, the position calculations for either the single wedge-and-wedge anode unit, or a pair of wedge-and-wedge anode units for the shared electrode, or a larger group of wedge-and-wedge anode units with shared electrodes, will yield inconsistent results and the data for all wedge-and-wedge anode units involved must be rejected. A second possibility for all charge flags not being false after completion of path B is that there are events on three or more wedge-and-wedge anode units which have electrodes which are commonly connected. This category of anode units can be further divided into open groups and closed groups. Open groups are those in which the common connections to the electrodes form an open line of three or more points with one more shared sides. That is to say, the three or more anode units have electrodes which are connected through conducting lines which do not form a closed polygon through the points of the anode units.

For open groups, the positions of the events on the anode units can be determined using the following procedure:

1. Solve for the X and Y positions in the wedge-and-wedge anode unit on one end of the poly-line defined by the anode units by using the three independent electrodes for that unit.
2. Back-calculate for the charge on the common electrode.
3. Subtract the calculated charge from the charge measured on the common electrode.
4. Save the X and Y value positions and remove the wedge-and-wedge anode unit for which the calculations were made from the open group.
5. Go back to step one, using the data from the next wedge-and-wedge anode unit on the new "end" of the poly-line after removal of the data from the previously evaluated wedge-and-wedge anode unit.
6. For the last wedge-and-wedge anode unit on the poly-line, all four electrode charges are known. Both sets of X and Y positions are calculated to confirm that the results are consistent. If the results are inconsistent, one wedge-and-wedge anode unit in the chain had two or more events, and all data must be rejected.

If the common electrodes from the three or more wedge-and-wedge anode units form a closed polygon at some region in the group, there is a closed group. If only three wedge-and-wedge anode units are involved, so that a triangle is formed by the polyline defined by the connecting conductors, sufficient information is known to calculate the positions. If four or more wedge-and-wedge anode units are present in a closed group, the exact configuration is important in determining whether sufficient information is available. If the closed polygon is formed of intersecting conductors where only a single intersection of conductors occurs at each unit, then sufficient information is available to calculation positions. If more than two conductors intersect at any anode unit, then sufficient information is not available.

The foregoing procedure for determining the position of events in an array formed of wedge-and-wedge anode units can also be utilized where the individual anode unit is constructed other than using the wedge-and-wedge structure of the present invention, but which nonetheless provides four (or more) output signals which can yield redundant calculations of the position of an event on each anode unit. An example of such an anode unit yielding redundant information is the double delay line anode.

Single and double delay line anodes (SDL, DDL) are microchannel plate based position sensitive detectors developed in the past few years. They combine the principles of a planar delay line anode with a wedge anode of the wedge-and-strip anode. The delay line is used to determine the X position of the event and the wedges are used to determine the Y position. The double delay line anode can be used in an interconnected array configuration identical to that used for the wedge-and-wedge anode units of the present invention with, the same basic principles and benefits as with the wedge-and-wedge anode. Such delay line anodes are described in, for example, Siegmund, et al., in *Photoelectronic Image Devices* (book), Institute of Physics Publishing, Ltd., Bristol, England, 1991, pp. 123–130; and M. Lampton, et al., "Delay Line Anodes For Microchannel Plate Spectrometers", Rev. Sci. Instrum., Vol. 58, No. 12, December 1987, pp. 2298–2304.

The single delay line anode (SDL) is similar in appearance to a coplanar wedge-and-strip anode, but the serpentine electrode is used as a delay line anode instead of being used as the strip electrode of the wedge and strip anode. The wedges of the SDL are used in the same manner for Y position calculation as the wedges of the wedge-and-strip anode. The serpentine electrode is used as a delay line anode, in which the X position is determined by measuring the difference in time between the signal reaching the two ends of the delay line and comparing this to the total time required for a signal to travel the length of the delay line. One disadvantage of the configuration of the SDL anode is that the charge from the microchannel plate is divided in half, one half for the X measurement and the other for the Y measurement.

Because of this problem, a different configuration, the double delay line (DDL) anode, was developed. In the DDL, the full charge can be used for both the X and Y measurements. In this configuration, the charge is first divided on two sets of wedges. These wedges define the active area of the detector and divide the charge for the Y measurement in the same way that the wedges of a WSA divide the charge. The charge from each set of wedges then flows to a delay line. The charge on each delay line divides and flows to the two ends of the delay line, allowing the X position to be measured by measuring the difference in arrival time at the ends of the delay line. Timing and total charge collected is measured at each of the four outputs of the detector (at the ends of the delay lines). The X position is determined from the timing measurement of either of the two delay lines (either the difference in time between the signal reaching A and B or the difference between C and D) and the Y position is determined from the charge collected on both sets of wedges (A+B and C+D), as follows:

$$Y = (A+B)/[(A+B)+(C+D)]$$

In its current usage, the DDL position measurement requires only one set of two timing measurements for the X position ((A and B) or (C and D)) and all four electrodes charge measurements for the Y position.

The measuring information from the DDL anode may be used to make the calculation for the Y position in a slightly different manner such that redundant information is obtained from the measurements. If it is possible to determine the Y position from either the A and C electrodes or the B and D electrodes, any three of the four electrodes will contain enough information to determine both the X and Y position.

The manner in which the redundant measurement is obtained in the X direction is intrinsic to the design of the DDL; there are two delay lines, either of which can be used for the X measurement. For the Y measurement, the position calculations may be done in a different manner than discussed previously in the DDL literature. If the charge on the delay line divides in a predictable fashion between the two ends of the delay line, either the two left ends or two right ends of the delay line will supply all of the information that is required to determine the Y position (either A and C electrodes or B and D electrodes). Assume, for example, that the charge splits evenly between the two ends of the delay line. In this case, A=B and C=D, from which it can be seen (from the equation above) that:

$$\begin{aligned} Y &= (A+B)/[(A+B)+(C+D)] \\ &= (2A)/[(2A)+(2C)] \\ &= A/[A+C] = B/[B+D]. \end{aligned}$$

In this case, enough information is contained in any three of the four electrodes to determine both the X and Y position.

Even if the charge does not divide evenly, generally the charge will divide in a predictable fashion dependent upon the starting position on the delay lines. (The delay line can be thought of as a current divider circuit). Since the charge will reach the two delay lines at the same X position on both the top and bottom delay lines, the characteristics of the electrical circuit that will be evident to the charge towards both ends of the delay line will be the same on the top and bottom delay lines and the proportionality of charge between the ends of the delay line will be the same, i.e.:

$$B = P^*A \text{ and } D = P^*C$$

where P is the same for both equations. The fact that P is the same for both equations is the key to the redundant position calculation for the Y position and is due to the fact that charge reaches both delay lines at the same position. It follows from the original equations that the Y position can thus be calculated in two ways.

$$\begin{aligned} Y &= (A+B)/[(A+B)+(C+D)] \\ &= (A+PA)/[(A+PA)+(C+PC)] \\ &= A(1+P)/[A(1+P)+C(1+P)] \\ &= A/[A+C] = B/[B+D]. \end{aligned}$$

It is understood that the invention is not confined to the particular embodiments set forth herein as illustrative, but embraces such modified forms thereof as come within the scope of the following claims.

What is claimed is:

1. A position sensitive anode unit having top, bottom, left and right sides, comprising:
a plurality of sets of electrode elements formed on a planar surface of a substrate, each set comprising first, second, third and fourth electrode elements electrically isolated from each other, the first and third electrode elements having wedge shapes tapering from the top to the bottom of the unit and the second and fourth electrode elements having wedge shapes tapering from the bottom to the top, the sets arranged adjacent to each other between the left and right sides of the unit, the first and second electrode elements in each set increasing progressively in width from set to set across the unit and the third and fourth electrode elements decreasing progressively in width from set to set across the unit, and electrical conductors connecting together all of the first electrode elements in all of the sets to form a first electrode, all of the second electrode elements in all of the sets to form a second electrode, all of the third electrode elements in all of the sets to form a third electrode, and all of the fourth electrode elements in all of the sets to form a fourth electrode.

2. The anode unit of claim 1 wherein each electrode element in each set is a discrete wedge shaped conductor formed on the substrate.

3. The anode unit of claim 2 wherein each electrode element tapers to a point at one end.

4. The anode unit of claim 2 wherein each electrode element is formed as a truncated wedge.

5. The anode unit of claim 2 wherein the substrate is a multilayer substrate having conducting strips formed between the layers of the substrate and electrical conductors extending through the substrate to connect together the second electrode elements, the third electrode elements and the fourth electrode elements, and a conductor on the surface of the substrate to connect together the first electrode elements of the anode unit.

6. The anode unit of claim 2 wherein the substrate is a multilayer substrate having conducting strips formed between the layers of the substrate and electrical conductors extending through the substrate to connect together the first electrode elements, the second electrode elements, the third electrode elements, and the fourth electrode elements.

7. The anode unit of claim 1 wherein within each set of electrode elements, the first electrode element is at the left side of the set, the second electrode element is to the right of the first element, the third electrode element is to the right of the second element, and the fourth electrode element is to the right of the third element.

8. The anode unit of claim 1 wherein each electrode element is a planar conductor formed on the surface of the substrate and including electrical conductors on the surface of the substrate connecting together all of the first electrode elements, the second electrode elements, the third electrode elements, and the fourth electrode elements, wherein the first electrode elements are formed as wedge-shaped elements which extend from a conductive strip extending across the top of the unit and the fourth electrode elements are formed as wedge-shaped elements which extend from a conductive strip extending across the bottom of the unit, with the wedges of the fourth electrode elements intermeshed with the wedges of the first electrode elements, and wherein the second and third electrode elements are formed as continuous adjacent conductive strips which extend between the intermeshed wedges of the first and fourth electrode elements and extend from the left side of the unit to the right side of the unit, the portions of the second electrode elements between the wedges of the first and fourth electrode elements tapering down in width from the bottom to the top of the unit, and the portions of the third electrode elements between the wedges of the first and fourth electrode elements tapering down from the top to the bottom of the unit, such that in each set of electrode elements, the second and third electrode elements each comprise two split electrode elements which are connected by conducting stubs at their tops and bottoms.

9. The anode unit of claim 1 further including means for measuring the charge on each of the first, second, third and fourth electrodes, and means for calculating the position of a charge impact on the anode unit from the measured charges.

10. A position sensitive anode array for a detector comprising:
a plurality of position sensitive anode units arranged in an array of plural adjacent rows and columns of units, each position sensitive anode unit having top, bottom, left and right sides, and comprising a plurality of sets of electrode elements formed on a planar surface of a substrate, each set comprising first, second, third and fourth electrode elements electrically isolated from each other, the first and third electrode elements having wedge shapes tapering from the top to the bottom of the unit and the second and fourth electrode elements having wedge shapes tapering from the bottom to the top, the sets arranged adjacent to each other between the left and right of the unit, the first and second electrode elements in each set increasing progressively in width from set to set across the unit and the third and fourth electrode elements decreasing progressively in width from set to set across the unit, and electrical conductors connecting together all of the first electrode elements in all of the sets to form a first electrode, all of the second electrode elements in all of the sets to form a second electrode, all of the third electrode elements in all of the sets to form a third electrode, and all of the fourth electrode elements in all of the sets to form a fourth electrode;
conductors electrically connecting each of the first electrodes in each column of anode units, conductors electrically connecting each of the second electrodes in each row of anode units, conductors electrically connecting each of the third electrodes in each anode unit lying along diagonals of the array in one of the diagonal directions of the array, and conductors electrically connecting the fourth electrodes in anode units lying along the opposite diagonals of the array.

11. The position sensitive anode array of claim 10 wherein in each anode unit, each electrode element in each set is a discrete wedge shaped conductor formed on the substrate.

12. The position sensitive anode array of claim 11 wherein each electrode element tapers to a point at one end.

13. The position sensitive anode array of claim 11 wherein each electrode element is formed as a truncated wedge.

14. The position sensitive anode array of claim 11 wherein the substrate is a multilayer substrate, and wherein for each anode unit, electrical conductors extend through the substrate to conductors on a second layer of the substrate to connect together all of the second electrode elements, all of the third electrode elements, and all of the fourth electrode elements for each anode unit, wherein the conductors connecting together all of the first electrodes in each column are formed on the top surface of the substrate extending between the adjacent first electrode elements, wherein the conductors connecting the second electrodes in each row are formed on the second layer of the substrate, wherein the conductors connecting the third electrodes in each diagonal along one direction of the diagonals are formed on a third layer of the substrate, and wherein the conductors connecting the fourth electrodes in each diagonal along the opposite direction of diagonals are formed on a fourth layer of the substrate.

15. The position sensitive anode array of claim 11 wherein the substrate is a multilayer substrate having conducting strips formed between the layers of the substrate and electrical conductors extending through the substrate for each anode unit to connect together the first electrode elements, the second electrode elements, the third electrode elements, and the fourth electrode elements of each anode unit.

16. The position sensitive anode array of claim 11 wherein within each set of electrode elements for each anode unit, the first electrode element is at the left side of the set, the second electrode element is to the right of the first element, the third electrode element is to the right of the second element, and the fourth electrode element is to the right of the third element.

17. The position sensitive anode array of claim 10 wherein in each anode unit, each electrode element is a planar conductor formed on the surface of the substrate and including electrical conductors on the surface of the substrate connecting together all of the first electrode elements, the second electrode elements, the third electrode elements, and the fourth electrode elements, wherein the first electrode elements are formed as wedge-shaped elements which extend from a conductive strip extending across the top of the unit and the fourth electrode elements are formed as conductive wedge-shaped elements which extend from a conductive strip extending across the bottom of the unit with the wedges of the fourth electrode elements intermeshed with the wedges of the first electrode elements, and wherein the second and third electrodes are formed as continuous adjacent conductive strips which extend between the intermeshed wedges of the first and fourth electrode elements and extend from the left side of the unit to the right side of the unit, the portions of the second electrode elements between the wedges of the first and fourth electrode elements tapering down in width from the bottom to the top of the unit, and the portions of the third electrode elements between the wedges of the first and fourth electrode elements tapering down from the top to the bottom of the unit, such that in each set, the second and third electrode elements each comprise two split electrode elements which are connected by conducting stubs at their tops and bottoms.

18. The position sensitive anode array of claim 10 further including means for measuring the charge on each of the conductors connected to each of the first, second, third and fourth electrodes of each anode unit in the array unit, and means for calculating the position in the array of an anode unit which receives a charge impact and the position of the charge impact on the position sensitive anode unit from the measured charges.

19. A position sensitive detector comprising:
(a) means for converting an event impact into an emitted cloud of electrons correlated to the position of impact;
(b) a position sensitive anode unit mounted adjacent to the means for converting to receive the cloud of electrons emitted therefrom, the position sensitive anode unit comprising a plurality of sets of electrode elements formed on a planar surface of a substrate, each set comprising first, second, third and fourth electrode elements electrically isolated from each other, the first and third electrode elements having wedge shapes tapering from the top to the bottom of the unit and the second and fourth electrode elements having wedge shapes tapering from the bottom to the top, the sets arranged adjacent to each other between the left and right sides of the unit, the first and second electrode elements in each set increasing progressively in width from set to set across the unit and the third and fourth electrode elements decreasing progressively in width from set to set across the unit, and electrical conductors connecting together all of the first electrode elements in all of the sets to form a first electrode, all of the second electrode elements in all of the sets to form a second electrode, all of the third electrode elements in all of the sets to form a third electrode, and all of the fourth electrodes in all of the sets to form a fourth electrode; and
(c) means for measuring the charge on each of the first, second, third and fourth electrodes and means for calculating the position of a charge impact on the anode unit from the measured charges.

20. The position sensitive detector of claim 19 wherein in the anode unit each electrode element in each set is a discrete wedge shaped conductor formed on the substrate.

21. The position sensitive detector of claim 20 wherein each electrode element tapers to a point at one end.

22. The position sensitive detector of claim 20 wherein each electrode element is formed as a truncated wedge.

23. The position sensitive detector of claim 19 wherein the substrate is a multilayer substrate having conducting strips formed between the layers of the substrate and electrical conductors extending through the substrate to connect together all of the second electrode elements, all of the third electrode elements and all of the fourth electrode elements, and a conductor on the surface of the substrate to connect together all of the first electrode elements of the anode unit.

24. The position sensitive detector of claim 19 wherein the position of the charge cloud is calculated by the means for calculating in accordance with the following expressions, where the measured charges on the first, second, third, and fourth electrodes are $Q_a$, $Q_b$, $Q_c$, and $Q_d$, respectively:

$$X = Q_a/(Q_a + Q_c) \text{ and } X = Q_b/(Q_b + Q_d)$$

$$Y = Q_a/(Q_a + Q_b) \text{ and } Y = Q_c/(Q_c + Q_d)$$

and wherein the means for calculating further compares the two calculated X and Y values to determine if the same X and Y values are calculated.

25. The position sensitive detector of claim 19 wherein each electrode element is a planar conductor formed on the surface of the substrate and including electrical conductors on the surface of the substrate connecting together all of the first electrode elements, the second electrode elements, the third electrode elements and the fourth electrode elements, wherein the first electrode elements are formed as wedge-shaped elements which extend from a conductive strip extending across the top of the unit and the fourth electrode is formed as wedge elements which extend from a conductive strip extending across the bottom of the unit with the wedges of the fourth electrode elements intermeshed with the wedges of the first electrode elements, and wherein the second and third electrode elements are formed as continuous adjacent conductive strips which extend between the intermeshed wedges of the first and fourth electrode elements and extend from the left side of the unit to the right side of the unit, the portions of the second electrode elements between the wedges of the first and fourth electrode elements tapering down in width from the bottom to the top of the unit, and the portions of the third electrode elements between the wedges of the first and fourth electrodes elements tapering down from the top to the bottom of the unit, such that in each set, the second and third electrode elements each comprise two split electrode elements which are connected by conducting stubs at their tops and bottoms.

26. The position sensitive detector of claim 19 wherein within the substrate is a multilayer substrate having conducting strips formed between the layers of the substrate and electrical conductors extending through the substrate to connect together the first electrode elements, the second electrode elements, the third electrode elements, and the fourth electrode elements of the anode unit.

27. The position sensitive detector of claim 19 wherein within each set of electrode elements, the first electrode element is at the left side of the set, the second electrode element is to the right of the first element, the third electrode element is to the right of the second element, and the fourth electrode element is to the right of the third element.

28. The position sensitive detector of claim 27 wherein the means for calculating position from the measured charges does so in accordance with the following expressions, where the measured charges on the first, second, third and fourth electrodes are $Q_a$, $Q_b$, $Q_c$ and $Q_d$, respectively:

$$X = 2Q_a/(Q_a+Q_c) - \tfrac{1}{2} \text{ and } X = 2Q_b/(Q_b+Q_d) - \tfrac{1}{2}$$

$$Y = 2Q_a/(Q_a+Q_c) - \tfrac{1}{2} \text{ and } Y = 2Q_c/(Q_c+Q_d) - \tfrac{1}{2},$$

where the full span of the anode unit in the X and Y directions corresponds to a magnitude of 1, and wherein the means for calculating further compares the two calculated X and Y values to determine if the same X and Y values are calculated.

29. The position sensitive detector of claim 19 wherein the electrode elements are formed as truncated wedges and wherein the means for calculating position from the measured charges does so in accordance with the following expressions, where $Q_a$, $Q_b$, $Q_c$, and $Q_d$ are the measured charges on the first, second, third and fourth electrode, respectively:

$$X_{norm} = [1/(X_{max}-X_{min})] \bullet [Q_a/(Q_a+Q_c) - X_{min}]$$

and $$X_{norm} = [1/(X_{max}-X_{min})] \bullet [Q_b/(Q_b+Q_d) - X_{min}]$$

$$Y_{norm} = [1/(Y_{max}-Y_{min})] \bullet [Q_a/(Q_a+Q_b) - Y_{min}]$$

and $$Y_{norm} = [1/(Y_{max}-Y_{min})] \bullet [Q_c/(Q_c+Q_a) - Y_{min}]$$

where $X_{max}$, $X_{min}$, $Y_{max}$, and $Y_{min}$ are the fractional values of the extremes of the anode unit which is a truncation of an anode unit formed of full wedges which taper to a point, and wherein the means for calculating further compares the two calculated X and Y values to determine if the same X and Y values are calculated.

30. The position sensitive detector of claim 19 wherein there are a plurality of anode units arranged in an array of adjacent rows and columns, and conductors connecting together all of the first electrodes in each column of anode units, each of the second electrodes in each row of anode units, each of the third electrodes in anode units lying along diagonals of the array in one of the diagonal directions of the array, and each of the fourth electrodes in anode units lying along the opposite diagonals of the array.

31. The position sensitive detector of claim 30 including means for calculating the position in the array at which an event occurs in accordance with the expressions:

$$X_{array} = W_x \bullet (I-1) + X$$

$$Y_{array} = W_y \bullet (J-1) + Y$$

where $W_x$ is the width of a single anode unit, $W_y$ is the height of a single anode unit, I is the column number and J is the row number of the anode unit where the event took place, and X and Y are the calculated positions of the event on that anode unit.

32. The position sensitive detector of claim 19 wherein the means for converting includes a microchannel plate.

33. A position sensitive detector comprising:
(a) means for converting an event impact into an emitted cloud of electrons correlated to the position of impact;
(b) a plurality of position sensitive anode units arranged in an array of plural adjacent rows and columns, the array of anode units mounted adjacent to the means for converting to receive the cloud of electrons emitted therefrom, each position sensitive anode unit including first, second, third and fourth electrodes, the electrodes arranged such that the signals on the electrodes from a charge cloud impact allow two separate calculations of the X and Y positions of the charge cloud impact to be calculated, and conductors connecting together all of the first electrodes in each column of anode units, each of the second electrodes in each row of anode units, each of the third electrodes in anode units lying along diagonals of the array in one of the diagonal directions of the array, and conductors connecting together the fourth electrodes in anode units lying along the opposite diagonals of the array.

34. The position sensitive detector of claim 33 including means for measuring the charge on the conductors connecting first electrodes in each column, the conductors connecting second electrodes in each row, the conductors connecting third electrodes in one direction of the diagonals, and the conductors connecting the fourth electrodes in the other direction of the diagonals.

35. The position sensitive detector of claim 33 wherein each anode unit has top, bottom, left and right sides and comprises a plurality of sets of electrode elements formed on a planar surface of a substrate, each set comprising first, second, third and fourth electrode elements electrically isolated from each other, the first and third electrode elements having wedge shapes tapering from the top to the bottom of the unit and the second and fourth electrodes having wedge shapes tapering from the bottom to the top, the sets arranged adjacent to each other between the left and right sides of the unit, the first and second electrode elements in each set increasing progressively in width from set to set across the unit and the third and fourth electrode elements decreasing progressively in width from set to set across the unit, and electrical conductors connecting together all of the first electrode elements in all of the sets to form a first electrode, all of the second electrode elements in all of the sets to form a second electrode, all of the third electrode elements in all of the sets to form a third electrode, and all of the fourth electrode elements in all of the sets to form a fourth electrode.

36. The position sensitive detector of claim 35 wherein in each anode unit, each electrode element in each set is a discrete wedge shaped conductor formed on the substrate.

37. The position sensitive detector of claim 36 wherein each electrode element tapers to a point at one end.

38. The position sensitive detector of claim 36 wherein each electrode element is formed as a truncated wedge.

39. The position sensitive detector of claim 35 further including means for measuring the charge on the conductors connecting the first electrodes in each column the conductors connecting the second electrodes in each row, the conductors connecting the third electrodes in one direction of the diagonals, and the conductors connecting the fourth electrodes in the other direction of the diagonals, and means for calculating the position in the array of an anode unit which receives a charge impact and the position of the charge impact on the position sensitive anode unit from the measured charges.

40. The position sensitive detector of claim 39 wherein the position of the charge cloud on an anode unit is calculated by the means for calculating in accordance with the following expressions, where the measured charges on the first, second, third, and fourth electrodes of the anode are $Q_a$, $Q_b$, $Q_c$, and $Q_d$, respectively:

$$X=Q_a/(Q_a+Q_c) \text{ and } X=Q_b/(Q_b+Q_d)$$

$$Y=Q_a/(Q_a+Q_b) \text{ and } Y=Q_c/(Q_c+Q_d)$$

and wherein the means for calculating further compares the two calculated X and Y values to determine if the same X and Y values are calculated.

41. The position sensitive detector of claim 39 wherein the means for calculating position in an anode unit does so in accordance with the following expressions, where the measured charges on the first, second, third and fourth electrodes of the anode unit are $Q_a$, $Q_b$, $Q_c$ and $Q_d$, respectively:

$$X=2Q_a/(Q_a+Q_c)-\tfrac{1}{2} \text{ and } X=2Q_b/(Q_b+Q_d)-\tfrac{1}{2}$$

$$Y=2Q_a/(Q_a+Q_c)-\tfrac{1}{2} \text{ and } Y=2Q_c/(Q_c+Q_d)-\tfrac{1}{2},$$

where the full span of the anode unit in the X and Y directions corresponds to a magnitude of 1, and wherein the means for calculating further compares the two calculated X and Y values to determine if the same X and Y values are calculated.

42. The position sensitive detector of claim 39 wherein the electrode elements in each anode unit are formed as truncated wedges and wherein the means for calculating position in an anode unit does so in accordance with the following expressions, where $Q_a$, $Q_b$, $Q_c$, and $Q_d$ are the measured charges on the first, second, third and fourth electrode, respectively:

$$X_{norm}=[1/(X_{max}-X_{min})] \bullet [Q_a/(Q_a+Q_c)-X_{min}]$$

and $$X_{norm}=[1/(X_{max}-X_{min})] \bullet [Q_b/(Q_b+Q_d)-X_{min}]$$

$$Y_{norm}=[1/(Y_{max}-Y_{min})] \bullet [Q_a/(Q_a+Q_b)-Y_{min}]$$

and $$Y_{norm}=[1/(Y_{max}-Y_{min})] \bullet [Q_c/(Q_c+Q_d)-Y_{min}]$$

where $X_{max}$, $X_{min}$, $Y_{max}$, and $Y_{min}$ are the fractional values of the extremes of the anode unit which is a truncation of an anode unit formed of full wedges which taper to a point, and wherein the means for calculating further compares the two calculated X and Y values to determine if the same X and Y values are calculated.

43. The position sensitive detector of claim 39 including means for calculating the position in the array at which an event occurs in accordance with the expressions:

$$X_{array}=W_x \bullet (I-1)+X$$

$$Y_{array}=W_y \bullet (J-1)+y$$

where $W_x$ is the width of a single anode unit, $W_y$ is the height of a single anode unit, I is the column number and J is the row number of the anode unit where the event took place, and X and Y are the calculated positions of the event on that anode unit.

44. The position sensitive detector of claim 34 wherein the means for converting includes a microchannel plate.

* * * * *

UNITED STATES PATENT AND TRADEMARK OFFICE
CERTIFICATE OF CORRECTION

PATENT NO. : 5,347,132          Page 1 of 2
DATED : September 13, 1994
INVENTOR(S) : Louis M. Holzman, et al.

It is certified that error appears in the above-indentified patent and that said Letters Patent is hereby corrected as shown below:

In column 7, line 57 of the patent, "$X=Qa/(Qa+Qc)$ and $X=Qb/(Qb+Qa)$" should be --$X=Qa/(Qa+Qc)$ and $X=Qb/(Qb+Qd)$-- line 5.

In column 7, line 58 of the patent, "$Y=Qa/(Qa+Qb)$ and $Y=Qc/(Qc+Qa)$" should be --$Y=Qa/(Qa+Qb)$ and $Y=Qc/(Qc+Qd)$-- line 6.

In column 20, line 10 of the patent, --sides-- should be inserted after "right"

In column 23, line 54 of the patent, "$Y_{norm}=[1/(Y_{max}-Y_{min})]\cdot[Q_c+Q_a)-Y_{min}]$" should be --$Y_{norm}=[1/(Y_{max}-Y_{min})]\cdot[Q_c+Q_d)-Y_{min}]$--

UNITED STATES PATENT AND TRADEMARK OFFICE
CERTIFICATE OF CORRECTION

PATENT NO. : 5,347,132
DATED : September 13, 1994
INVENTOR(S) : Louis M. Holzman, et al.

It is certified that error appears in the above-indentified patent and that said Letters Patent is hereby corrected as shown below:

In column 25, line 19 of the patent, "column" should be --column,--

Signed and Sealed this

Nineteenth Day of September, 1995

Attest:

BRUCE LEHMAN

Attesting Officer

Commissioner of Patents and Trademarks